US009837247B2

(12) United States Patent
Kato et al.

(10) Patent No.: US 9,837,247 B2
(45) Date of Patent: Dec. 5, 2017

(54) CHARGED PARTICLE BEAM WRITING APPARATUS AND METHOD UTILIZING A SUM OF THE WEIGHTED AREA DENSITY OF EACH FIGURE PATTERN

(71) Applicant: NuFlare Technology, Inc., Yokohama (JP)

(72) Inventors: Yasuo Kato, Kanagawa (JP); Hiroshi Matsumoto, Kanagawa (JP)

(73) Assignee: NuFlare Technology Co., Inc., Yokohama (JP)

( * ) Notice: Subject to any disclaimer, the term of this patent is extended or adjusted under 35 U.S.C. 154(b) by 0 days.

(21) Appl. No.: 14/450,474

(22) Filed: Aug. 4, 2014

(65) Prior Publication Data

US 2015/0041684 A1  Feb. 12, 2015

(30) Foreign Application Priority Data

Aug. 8, 2013  (JP) .................................. 2013-165494

(51) Int. Cl.
  *H01J 37/302*  (2006.01)
  *H01J 37/317*  (2006.01)

(52) U.S. Cl.
  CPC ...... *H01J 37/3026* (2013.01); *H01J 37/3174* (2013.01); *H01J 2237/31769* (2013.01); *H01J 2237/31776* (2013.01)

(58) Field of Classification Search
  CPC .............. H01J 37/3026; H01J 37/3174; H01J 2237/31761; H01J 2237/31764; H01J 2237/31769

See application file for complete search history.

(56) References Cited

U.S. PATENT DOCUMENTS 6,562,523 B1 * 5/2003 Wu ..................... C03C 3/093
  430/13
6,610,989 B1 * 8/2003 Takahashi ............. B82Y 10/00
  250/492.1

(Continued)

FOREIGN PATENT DOCUMENTS

JP   2007-150243   6/2007
JP   2010-161099 A   7/2010

(Continued)

OTHER PUBLICATIONS

Office Action dated May 16, 2016 in Taiwanese Patent Application No. 103124278 (with English-language Translation).

(Continued)

*Primary Examiner* — Jason McCormack
*Assistant Examiner* — Sean Luck
(74) *Attorney, Agent, or Firm* — Oblon, McClelland, Maier & Neustadt, L.L.P.

(57) ABSTRACT

A charged particle beam writing apparatus includes an area density calculation unit to calculate a pattern area density weighted using a dose modulation value, which has previously been input from an outside and in which an amount of correction of a dimension variation due to a proximity effect has been included, a fogging correction dose coefficient calculation unit to calculate a fogging correction dose coefficient for correcting a dimension variation due to a fogging effect by using the pattern area density weighted using the dose modulation value having been input from the outside, a dose calculation unit to calculates a dose of a charged particle beam by using the fogging correction dose coefficient and the dose modulation value, and a writing unit to write a pattern on a target object with the charged particle beam of the dose.

4 Claims, 14 Drawing Sheets

(56) References Cited

U.S. PATENT DOCUMENTS

| | | | |
|---|---|---|---|
| 7,525,110 B2* | 4/2009 | Suzuki | B82Y 10/00 250/492.22 |
| 2002/0027198 A1* | 3/2002 | Nagata | H01J 37/3026 250/307 |
| 2005/0221204 A1* | 10/2005 | Kimura | G03F 1/78 430/5 |
| 2007/0114453 A1* | 5/2007 | Emi | B82Y 10/00 250/492.2 |
| 2007/0114459 A1* | 5/2007 | Suzuki | B82Y 10/00 250/492.22 |
| 2007/0192757 A1* | 8/2007 | Emi | B82Y 10/00 716/53 |
| 2007/0194250 A1* | 8/2007 | Suzuki | B82Y 10/00 250/492.2 |
| 2007/0196768 A1* | 8/2007 | Ogino | B82Y 10/00 430/296 |
| 2008/0067446 A1* | 3/2008 | Belic | B82Y 10/00 250/492.22 |
| 2008/0073574 A1* | 3/2008 | Kamikubo | B82Y 10/00 250/492.2 |
| 2010/0173235 A1* | 7/2010 | Kato | B82Y 10/00 430/30 |
| 2011/0033788 A1* | 2/2011 | Kato | B82Y 10/00 430/30 |
| 2011/0068281 A1 | 3/2011 | Hara et al. | |
| 2011/0253911 A1* | 10/2011 | Matsumoto | B82Y 10/00 250/492.3 |
| 2012/0001097 A1* | 1/2012 | Yashima | H01J 37/3174 250/492.22 |
| 2012/0007002 A1* | 1/2012 | Nakayamada | B82Y 10/00 250/492.22 |
| 2012/0064440 A1* | 3/2012 | Fujimura | B82Y 10/00 430/5 |
| 2012/0068089 A1* | 3/2012 | Nakayamada | B82Y 10/00 250/492.22 |
| 2012/0085940 A1* | 4/2012 | Matsumoto | B82Y 10/00 250/492.3 |
| 2012/0292537 A1* | 11/2012 | Yashima | H01J 37/3174 250/492.22 |
| 2012/0329289 A1* | 12/2012 | Fujimura | H01J 37/3174 438/795 |
| 2013/0070222 A1* | 3/2013 | Fujimura | G03F 1/36 355/53 |
| 2013/0099139 A1* | 4/2013 | Kato | H01J 37/3174 250/492.3 |
| 2014/0138527 A1 | 5/2014 | Kato et al. | |

FOREIGN PATENT DOCUMENTS

| | | |
|---|---|---|
| JP | 2011-66264 | 3/2011 |
| JP | 2012-69667 | 4/2012 |
| JP | 2014-103308 | 6/2014 |

OTHER PUBLICATIONS

Japanese Office Action dated May 9, 2017, issued in Japanese Patent Application No. 2013-165494 (with English translation).

* cited by examiner

| $D_L(x)$ | $D_P(x)$ | $\Delta CD$ |
|---|---|---|
| . | . | . |
| . | . | . |
| . | . | . |

CHARGED PARTICLE BEAM WRITING APPARATUS AND METHOD UTILIZING A SUM OF THE WEIGHTED AREA DENSITY OF EACH FIGURE PATTERN

CROSS-REFERENCE TO RELATED APPLICATION

This application is based upon and claims the benefit of priority from the prior Japanese Patent Application No. 2013-165494 filed on Aug. 8, 2013 in Japan, the entire contents of which are incorporated herein by reference.

BACKGROUND OF THE INVENTION

Field of the Invention

The present invention relates to a charged particle beam writing apparatus and a charged particle beam writing method. More specifically, for example, the present invention relates to a method for correcting a dose of charged particle beam emitted from a writing apparatus.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also referred to as a mask or a reticle) of high accuracy is needed. Thus, the electron beam (EB) writing technique, which intrinsically has excellent resolution, is used for producing such a high-precision master pattern.

FIG. 16 is a conceptual diagram explaining operations of a variable shaping type electron beam writing or "drawing" apparatus. The variable shaping type electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method for forming a given shape by letting beams pass through both the aperture 411 of the first aperture plate 410 and the variable shape aperture 421 of the second aperture plate 420 is referred to as a variable shaped beam (VSB) system (refer to, e.g., Japanese Patent Application Laid-open (JP-A) No. 2012-069667).

In electron beam writing, dimension change occurs due to a mask process or an unknown mechanism, which is solved by adjusting the amount of dose of an electron beam. In recent years, there is performed setting a dose modulation value which is a value for modulating a dose, which additionally controls a dose amount, for each figure pattern by a user or a correction tool, etc. at the stage before inputting data into a writing apparatus. This technique makes it possible to previously include, in the dose modulation value, a correction amount calculated outside the writing apparatus for correcting a proximity effect and a phenomenon, etc. that affects dimensions in a range smaller than that of the proximity effect. As long as correction is performed for only the proximity effect, etc. previously included in the dose modulation value, what is necessary is just to set a dose, in the writing apparatus, to be in accordance with the dose modulation value. However, in electron beam writing, there is a case where correction calculation is further performed for phenomena, such as a fogging effect and a loading effect, in addition to the proximity effect, (refer to, e.g., Japanese Patent Application Laid-open No. 2012-069667). Conventionally, correction calculation is performed for a proximity effect inside the writing apparatus, and using a result of this calculation, correction calculation is performed for a fogging effect or a loading effect. Therefore, if a correction amount for proximity effect correction is included in the dose modulation value input from the outside of the apparatus, there occurs a problem in that it becomes difficult to perform correction calculation for a fogging effect or a loading effect in the writing apparatus. It may be theoretically possible to also calculate an amount of correction of the fogging effect and the loading effect outside the writing apparatus and input the amount into the apparatus. However, in that case, since pattern data of the same chip needs to be prepared for each global arrangement, the amount of the data to be input into the writing apparatus becomes enormous.

BRIEF SUMMARY OF THE INVENTION

In accordance with one aspect of the present invention, a charged particle beam writing apparatus includes an area density calculation unit configured to calculate a pattern area density weighted using a dose modulation value, which has previously been input from an outside and in which an amount of correction of a dimension variation due to a proximity effect has been included, a fogging correction dose coefficient calculation unit configured to calculate a fogging correction dose coefficient for correcting a dimension variation due to a fogging effect by using the pattern area density weighted using the dose modulation value having been input from the outside, a dose calculation unit configured to calculates a dose of a charged particle beam by using the fogging correction dose coefficient and the dose modulation value, and a writing unit configured to write a pattern on a target object with the charged particle beam of the dose.

In accordance with another aspect of the present invention, a charged particle beam writing apparatus includes a dimension variation amount calculation unit configured to calculate a dimension variation amount due to a loading effect by using a pattern area density of each mesh region obtained by virtually dividing a writing region into a plurality of mesh regions, a proximity effect correction dose coefficient calculation unit configured to calculate a proximity effect correction dose coefficient for correcting a dimension variation due to a proximity effect by using the pattern area density, a loading effect correction dose coefficient acquisition unit configured to acquire a loading effect correction dose coefficient corresponding to a calculated dimension variation amount due to the loading effect and a calculated proximity effect correction dose coefficient, by using a correlation of the loading effect correction dose coefficient for correcting the dimension variation due to the loading effect, the proximity effect correction dose coefficient for correcting the dimension variation due to the proximity effect, and the dimension variation amount due to the loading effect, a dose calculation unit configured to calculate a dose of a charged particle beam by using an acquired loading effect correction dose coefficient and a dose modulation value, which has previously been input from an outside and in which an amount of correction of the dimension variation due to the proximity effect has been included, and a writing unit configured to write a pattern on a target object with the charged particle beam of the dose, wherein the loading effect correction dose coefficient is defined by a value obtained by dividing a first product by a second product, where the first product is calculated by multiplying a first base dose that corrects a dimension variation amount due to a loading effect while maintaining correction of a proximity effect by a first proximity effect correction dose coefficient obtained by using a first proximity effect correction coefficient being grouped with the first base dose, and the second product is calculated by multiplying a second base dose that corrects a dimension variation amount due to a proximity effect without performing correction of a dimension variation amount due to a loading effect by a second proximity effect correction dose coefficient obtained by using a second proximity effect correction coefficient being grouped with the second base dose.

Moreover, in accordance with another aspect of the present invention, a charged particle beam writing apparatus includes a dimension variation amount calculation unit configured to calculate a dimension variation amount due to a loading effect by using a pattern area density of each mesh region obtained by virtually dividing a writing region into a plurality of mesh regions, a proximity effect correction dose coefficient calculation unit configured to calculate a proximity effect correction dose coefficient for correcting a dimension variation due to a proximity effect by using the pattern area density, a loading effect correction dose coefficient acquisition unit configured to acquire a loading effect correction dose coefficient corresponding to a calculated dimension variation amount due to the loading effect and a calculated proximity effect correction dose coefficient, by using a correlation of the loading effect correction dose coefficient for correcting the dimension variation due to the loading effect, the proximity effect correction dose coefficient for correcting the dimension variation due to the proximity effect, and the dimension variation amount due to the loading effect, a dose calculation unit configured to calculate a dose of a charged particle beam by using an acquired loading effect correction dose coefficient and a dose modulation value, which has previously been input from an outside and in which an amount of correction of the dimension variation due to the proximity effect has been included, and a writing unit configured to write a pattern on a target object with the charged particle beam of the dose, wherein the loading effect correction dose coefficient is defined by a value where a term obtained by dividing a dimension variation amount due to a loading effect by a dose latitude which is a coefficient indicating a relation between a pattern dimension and a dose of an electron beam and which depends upon a proximity effect density is used as an exponential index.

Furthermore, in accordance with another aspect of the present invention, a charged particle beam writing method includes calculating a pattern area density weighted using a dose modulation value, which has previously been input from an outside and in which an amount of correction of a dimension variation due to a proximity effect has been included, calculating a fogging correction dose coefficient for correcting a dimension variation due to a fogging effect by using the pattern area density weighted using the dose modulation value having been input from the outside, calculating a dose of a charged particle beam by using the fogging correction dose coefficient and the dose modulation value, and writing a pattern on a target object with the charged particle beam of the dose.

Furthermore, in accordance with another aspect of the present invention, a charged particle beam writing method includes calculating a dimension variation amount due to a loading effect by using a pattern area density of each mesh region obtained by virtually dividing a writing region into a plurality of mesh regions, calculating a proximity effect correction dose coefficient for correcting a dimension variation due to a proximity effect by using the pattern area density, acquiring a loading effect correction dose coefficient corresponding to a calculated dimension variation amount due to the loading effect and a calculated proximity effect correction dose coefficient, by using a correlation of the loading effect correction dose coefficient for correcting the dimension variation due to the loading effect, the proximity effect correction dose coefficient for correcting the dimension variation due to the proximity effect, and the dimension variation amount due to the loading effect, calculating a dose of a charged particle beam by using the loading effect correction dose coefficient and a dose modulation value, which has previously been input from an outside and in which an amount of correction of the dimension variation due to the proximity effect has been included, and writing a pattern on a target object with the charged particle beam of the dose, wherein the loading effect correction dose coefficient is defined by a value obtained by dividing a first product by a second product, where the first product is calculated by multiplying a first base dose that corrects a dimension variation amount due to a loading effect while maintaining correction of a proximity effect by a first proximity effect correction dose coefficient obtained by using a first proximity effect correction coefficient being grouped with the first base dose, and the second product is calculated by multiplying a second base dose that corrects a dimension variation amount due to a proximity effect without performing correction of a dimension variation amount due to a loading effect by a second proximity effect correction dose coefficient obtained by using a second proximity effect correction coefficient being grouped with the second base dose.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used. Moreover, a variable shaping type beam (VSB system) writing apparatus will be described as an example of a charged particle beam apparatus.

In the embodiments below, there will be described an apparatus and method that can perform a correction calculation also for a phenomenon, such as a fogging effect and a loading effect when inputting a dose modulation value which is a value for modulating a dose, including an amount of correction of a proximity effect from the outside of the apparatus.

First Embodiment

Figure 1:
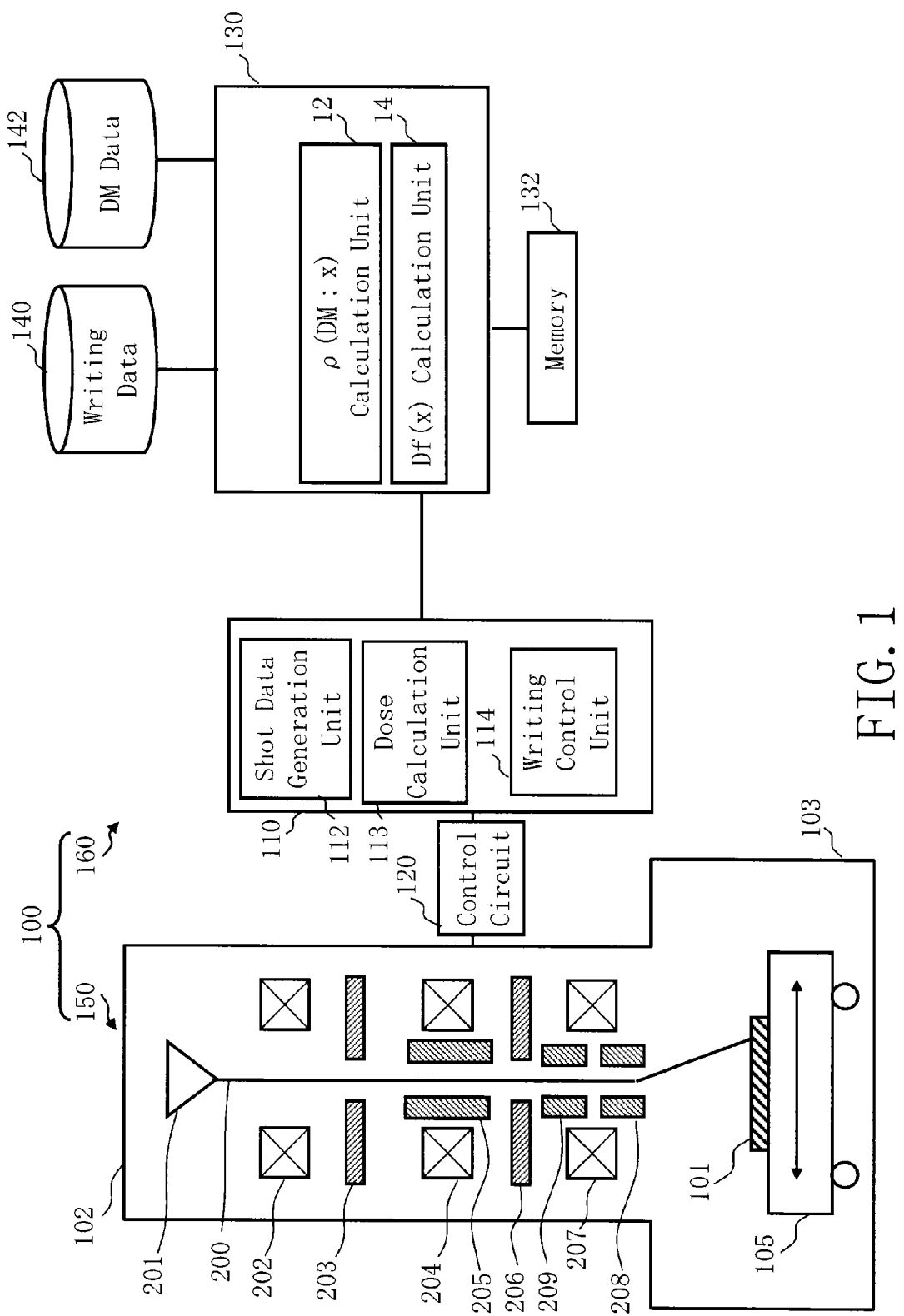
FIG. 1 is a schematic diagram showing a configuration of a writing apparatus according to the first embodiment.

FIG. 1 is a schematic diagram showing the configuration of a writing apparatus according to the first embodiment. As shown in FIG. 1, a writing (or "drawing") apparatus 100 includes a writing unit 150 and a control unit 160. The writing apparatus 100 is an example of a charged particle beam writing apparatus. Particularly, it is an example of a variable shaping typewriting apparatus. The writing unit 150 includes an electron optical column 102 and a writing chamber 103. In the electron optical column 102, there are arranged an electron gun assembly 201, an illumination lens 202, a first aperture member 203, a projection lens 204, a deflector 205, a second aperture member 206, an objective lens 207, a main deflector 208 and a sub-deflector 209. In the writing chamber 103, there is arranged an XY stage 105. On the XY stage 105, a target object or "sample" 101 such as a mask serving as a writing target is placed when performing writing. The target object 101 is, for example, an exposure mask used for manufacturing semiconductor devices. The target object 101 may be, for example, a mask blank on which resist is applied and a pattern has not yet been formed.

The control unit 160 includes a control computer 110, a control circuit 120, a preprocessing computer 130, a memory 132, and storage devices 140 and 142 such as a magnetic disk drive. The control computer 110, the control circuit 120, the preprocessing computer 130, the memory 132, and the storage devices 140 and 142 are mutually connected through a bus (not shown).

In the preprocessing computer 130, there are arranged a weighted area density calculation unit 12 and a fogging correction dose coefficient calculation unit 14. Functions such as the weighted area density calculation unit 12 and the fogging correction dose coefficient calculation unit 14 may be configured by hardware such as an electric circuit, or by software such as a program causing a computer to implement these functions. Alternatively, they may be configured by a combination of software and hardware. Data which is input and output to/from the weighted area density calculation unit 12 or the fogging correction dose coefficient calculation unit 14, and data being calculated are stored in the memory 132 each time.

In the control computer 110, there are arranged a shot data generation unit 112, a dose calculation unit 113, and a writing control unit 114. Each function, such as the shot data generation unit 112, the dose calculation unit 113, and the writing control unit 114, may be configured by hardware such as an electric circuit or by software such as a program causing a computer to implement these functions. Alternatively, they may be configured by a combination of hardware and software. Data which is input and output to/from the shot data generation unit 112, the dose calculation unit 113, or the writing control unit 114, and data being calculated are stored in the memory (not shown) each time.

FIG. 1 shows a configuration necessary for explaining the first embodiment. Other configuration elements generally necessary for the writing apparatus 100 may also be included. For example, a multiple stage deflector of two stages of the main deflector 208 and the sub deflector 209 is herein used for position deflection, but, however, a single stage deflector or a multiple stage deflector of three or more stages may also be used for position deflection. Moreover, an input device, such as a mouse, keyboard, etc., a monitoring device, an external interface circuit, etc. may also be connected to the writing apparatus 100.

Generally, calculation for dose amount correction including a proximity effect correction is performed inside the writing apparatus 100, but however, there may be a case where correction residual etc. remain even if the dose amount calculated in the writing apparatus is used. Therefore, the user sets a dose modulation value for each figure pattern at the stage before inputting data into the writing apparatus. Furthermore, according to the first embodiment, correction calculation for a proximity effect, which has conventionally been performed in the writing apparatus 100, is executed before being input into the writing apparatus in order to set a dose modulation value DM for each figure pattern. In other words, the amount of correction of a proximity effect has previously been included (taken into account) in a dose modulation value DM before being input into the writing apparatus. Calculating and setting of the dose modulation value DM is performed before inputting data into the writing apparatus 100. The amount of dose modulation is set by the user or the correction device, etc. (not shown). It is preferable for the dose modulation value DM to be defined, such as 0% to 200%, for example. However, it is not limited thereto. It is also preferable for the dose modulation value to be defined as a dose modulation rate, such as a value of 1.0 to 3.0, for example.

The dose modulation value (rate) DM data having been set is input into the writing apparatus 100 from the outside to be stored in the storage device 142. Moreover, writing data is input into the storage device 140 from the outside and stored therein. In the writing data, there are defined figure information, such as a figure type, arrangement coordinates, a figure size, etc., and index information by which each figure pattern is related to a dose modulation value DM.

Figure 2:
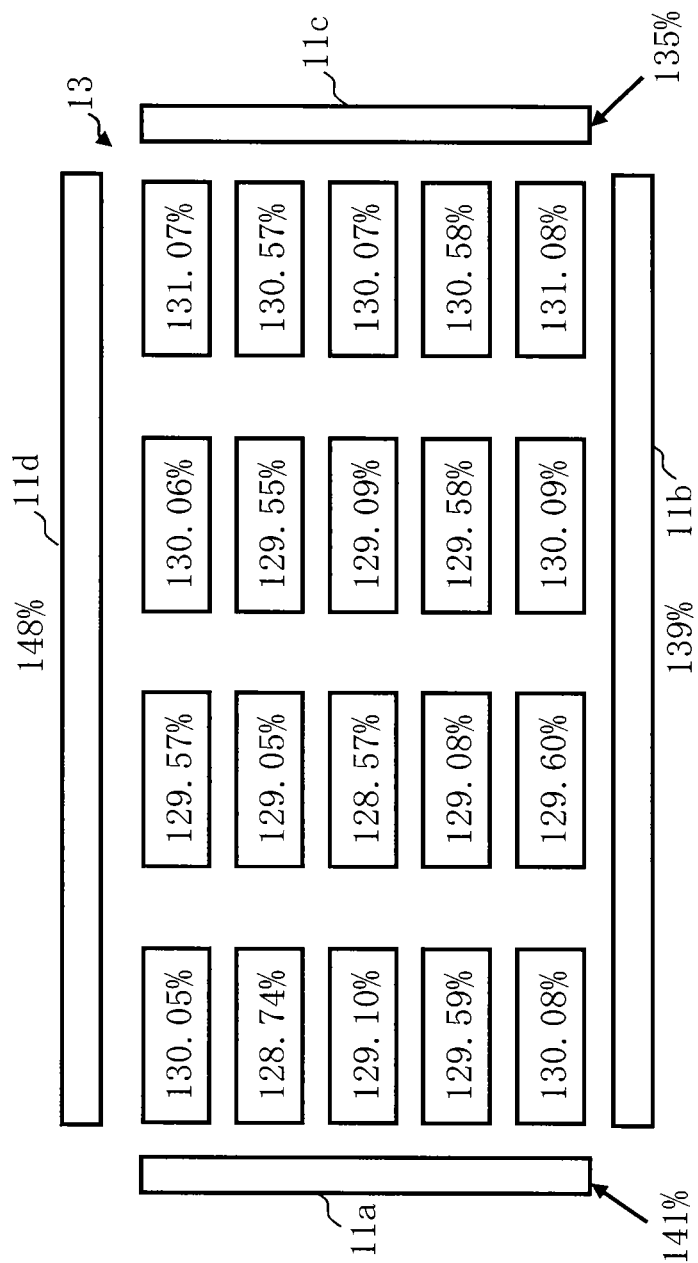
FIG. 2 shows an example of a pattern layout in which a dose modulation value is defined for each figure, according to the first embodiment.

FIG. 2 shows an example of a pattern layout in which a dose modulation value is defined for each figure, according to the first embodiment. In the example of FIG. 2, an array pattern 13 is arranged in the central part of the region surrounded by each circumferential layout. A lengthwise quadrangular pattern 11a of the dose modulation value of 141% is arranged at the left side of the array pattern. A cross-wise quadrangular pattern 11b of the dose modulation value of 139% is arranged at the bottom side of the array pattern. A lengthwise quadrangular pattern 11c of the dose modulation value of 135% is arranged at the right side of the array pattern. A cross-wise quadrangular pattern 11d of the dose modulation value of 148% is arranged at the upper side of the array pattern. If correction of a proximity effect or correction of a phenomenon whose influence range is smaller than that of the proximity effect is performed before inputting data into the writing apparatus, as shown in FIG. 2, the amount of dose modulation also changes in each arrayed figure pattern configuring the array pattern 13.

Figure 3:
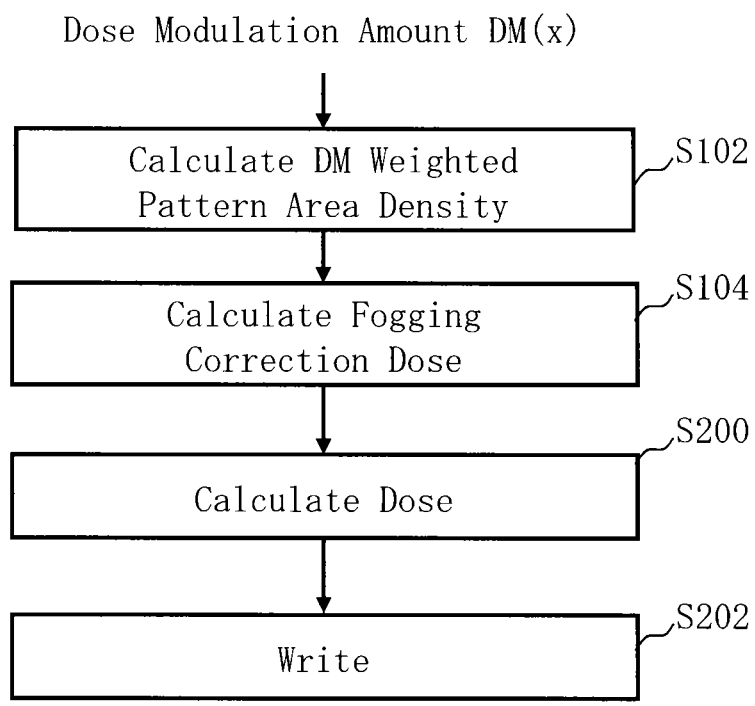
FIG. 3 is a flowchart showing main steps of a writing method according to the first embodiment.

FIG. 3 is a flowchart showing the main steps of a writing method according to the first embodiment. In the first embodiment, dose calculation for correcting a fogging effect is performed in the writing apparatus 100 by using a dose modulation value DM in which the amount of correction of a proximity effect has been included.

In a weighted area density calculation step (S102), the weighted area density calculation unit 12 calculates a pattern area density $\rho(DM:x)$ weighted using a dose modulation value DM which has previously been input from the outside and in which the amount of correction of a dimension variation due to a proximity effect has been included. The weighted area density calculation unit 12 is an example of an area density calculation unit. Specifically, the calculation is performed, for example, as follows. The weighted area density calculation unit 12 first virtually divides the writing region into a plurality of mesh regions of a predetermined size. It is preferable for the mesh size to be, for example, about 1/10 of the influence radius of the fogging effect, as the size of a global region, and specifically, to be about 100 to 500 μm, for example.

Then, the weighted area density calculation unit 12 inputs writing data from the storage device 140, and calculates, for each mesh region, an area density $\rho(x)$ of each figure pattern arranged in a mesh region concerned. Furthermore, the weighted area density calculation unit 12 inputs a dose modulation value DM(x) corresponding to a figure pattern concerned from the storage device 142, and performs weighting, for each figure pattern, by multiplying an area density $\rho(x)$ of a figure pattern concerned by a dose modulation value DM. The weighted area density calculation unit 12 calculates a weighted area density $\rho(DM:x)$ per mesh region by cumulatively adding (integrating) a weighted area density $\rho(x)DM(x)$ for each figure pattern arranged in each mesh region. The weighted area density $\rho(DM:x)$ can be obtained by solving the following equation (1), where the position x indicates a vector, not just the x direction in two dimensions, which applies hereinafter.

$$\rho(DM:x) = \sum_{in\ mesh} \rho(x) \cdot DM(x) \quad (1)$$

Alternatively, the weighted area density calculation unit 12 calculates, for each mesh region, the area of each figure pattern arranged in a mesh region concerned. Moreover, the weighted area density calculation unit 12 inputs a dose modulation value DM corresponding to a figure pattern concerned from the storage device 142, and performs weighting for each figure pattern by multiplying the area of a figure pattern concerned by a dose modulation value DM. It is also preferable that the weighted area density calculation unit 12 calculates a weighted area density $\rho(DM:x)$ by cumulatively adding a weighted area of each figure pattern arranged in each mesh region and dividing the cumulative value by a mesh region area.

In a calculation step (S104) of a fogging correction dose coefficient (also referred to as a fogging effect correction dose, which applies hereinafter), the fogging correction dose coefficient calculation unit 14 calculates a fogging correction dose coefficient $D_f(x)$ for correcting a dimension variation due to a fogging effect by using a pattern area density $\rho(DM:x)$ which has been weighted by a dose modulation value DM input from the outside. The fogging correction dose coefficient $D_f(x)$ can be obtained by solving the following equation (2) using a proximity effect correction coefficient (backscatter coefficient) $\eta$, a fogging correction coefficient $\theta$, a distribution function $g_f(x)$, and an area density $\rho(DM:x)$.

$$D_f(x)\left(\frac{1}{2} + \eta\right) + \theta \int D_f(x')g_f(x - x')\rho(DM:x')dx' = \frac{1}{2} + \eta \quad (2)$$

The fogging correction dose coefficient $D_f(x)$ calculated as described above is output into the control calculator 110.

In a dose calculation step (S200), the dose calculation unit 113 calculates a dose D(x) of the electron beam 200 by using the fogging correction dose coefficient $D_f(x)$ and a dose modulation value DM(x). The dose D(x) can be obtained by solving the following equation (3) using a fogging correction dose coefficient $D_f(x)$, a dose modulation value DM(x), and a base dose $D_B(x)$.

$$D(x) = D_B(x) \cdot D_f(x) \cdot DM(x) \quad (3)$$

Since an amount of correction of a proximity effect has already been included in the dose modulation value DM(x), the dose D(x) indicates a dose for correcting both a dimension variation due to the proximity effect and a dimension variation due to the fogging effect.

In a writing step (S202), the writing unit 150 writes a pattern on the target object 101 with the electron beam 200 having the dose of D(x). Specifically, it operates as described below. The shot data generation unit 112 reads writing data from the storage device 140, and performs data conversion processing of a plurality of steps so as to generate apparatus-specific shot data. In order to write a figure pattern by the writing apparatus 100, it needs to divide each figure pattern defined in the writing data to be the size that can be irradiated by one beam shot. Then, the shot data generation unit 112 divides each figure pattern into the size that can be irradiated by one beam shot so as to generate a shot figure to actually perform writing. Shot data is generated for each shot figure. In the shot data, there is defined figure data, such as a figure type, a figure size, and an irradiation position, for example.

The writing control unit 114 outputs a control signal to the control circuit 120 to perform writing processing. The control circuit 120 inputs shot data and data of each dose D(x), and controls the writing unit 150 based on the control signal from the writing control unit 114. The writing unit 150 writes a figure pattern concerned on the target object 100 with the electron beam 200. Specifically, it operates as follows:

The electron beam 200 emitted from the electron gun 201 (emission unit) irradiates the entire first aperture plate 203 having a quadrangular opening by the illumination lens 202. At this point, the electron beam 200 is shaped to be a quadrangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After having passed through the second aperture plate 206, the electron beam 200 of a second aperture image is focused by the objective lens 207 and deflected by the main deflector 208 and the sub deflector 209, and reaches a desired position on the target object 101 on the XY stage 105 which moves continuously. FIG. 1 shows the case of using a multiple stage deflection of two stages of the main and sub deflectors for position deflection. In such a case, the electron beam 200 of a shot concerned should be deflected to a reference position in a subfield (SF), which is obtained by further virtually dividing the stripe region, by the main deflector 208 while following the movement of the stage, and the beam of a shot concerned should be deflected to each irradiation position in the SF by the sub deflector 209. Moreover, the dose D(x) should be controlled by an irradiation time of the electron beam 200.

As described above, according to the first embodiment, when inputting a dose modulation value including an amount of correction of a proximity effect from the outside of the apparatus, a correction calculation can also be performed for a fogging effect. Therefore, both a dimension variation due to the proximity effect and a dimension variation due to the fogging effect can be corrected.

Second Embodiment

In the first embodiment, there has been described a method for calculating a fogging correction dose coefficient $D_f(x)$ without calculating a proximity effect correction dose coefficient $D_p(x)$. By contrast, in the second embodiment, there will be described a method for calculating a fogging correction dose coefficient $D_f(x)$ after calculating a proximity effect correction dose coefficient $D_p(x)$.

Figure 4:
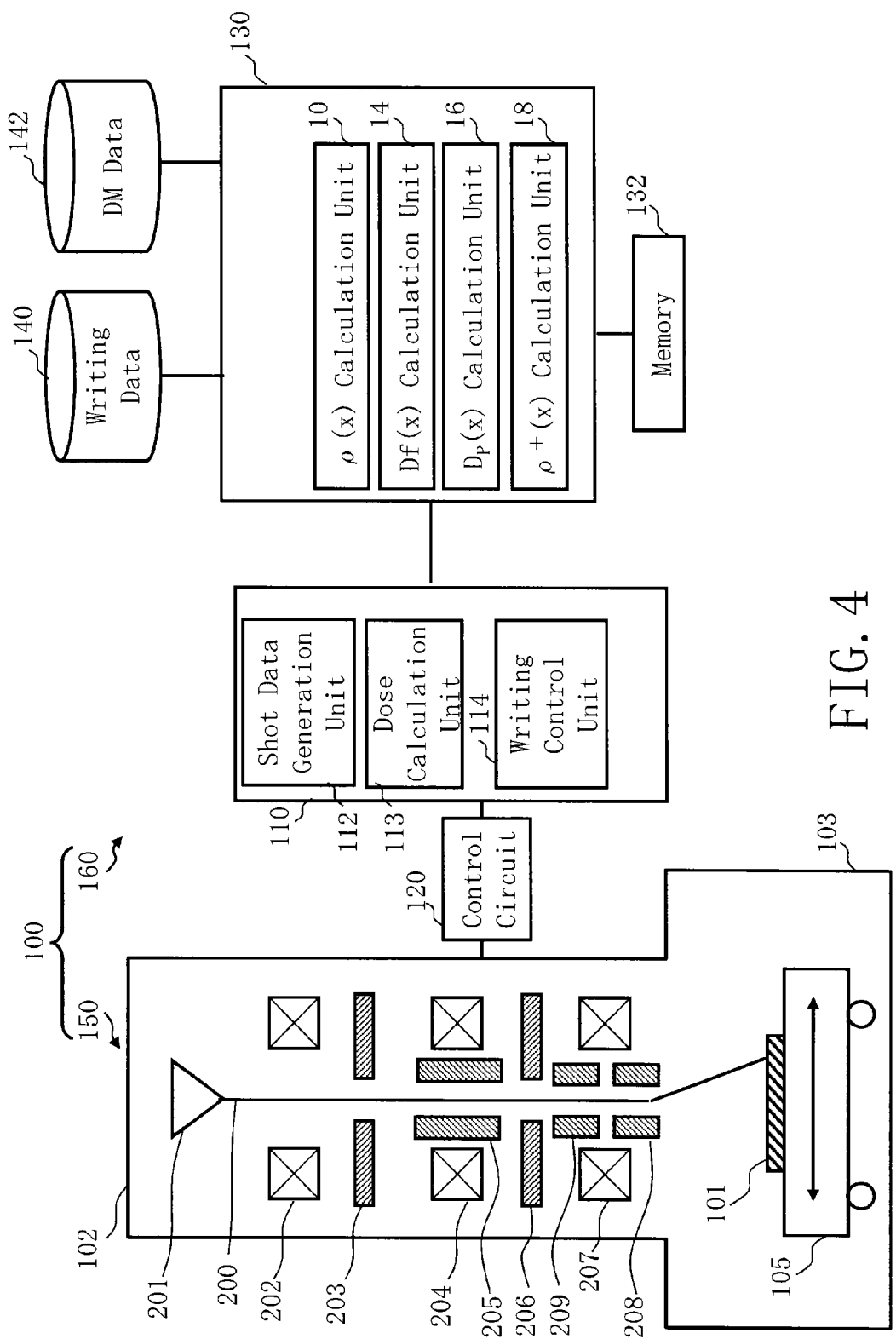
FIG. 4 is a schematic diagram showing a configuration of a writing apparatus according to the second embodiment.

FIG. 4 is a schematic diagram showing the configuration of a writing apparatus according to the second embodiment. FIG. 4 is the same as FIG. 1 except that a proximity effect correction dose coefficient calculation unit 16 and a dose density calculation unit 18 are further added in the preprocessing computer 130, and an area density calculation unit 10 is arranged instead of the weighted area density calculation unit 12.

Functions, such as the area density calculation unit 10, the fogging correction dose coefficient calculation unit 14, the proximity effect correction dose coefficient calculation unit 16, and the dose density calculation unit 18 may be configured by hardware such as an electric circuit, or by software such as a program causing a computer to implement these functions. Alternatively, they may be configured by a combination of software and hardware. Data which is input and output to/from the area density calculation unit 10, the fogging correction dose coefficient calculation unit 14, the proximity effect correction dose coefficient calculation unit 16, or the dose density calculation unit 18 and data being calculated are stored in the memory 132 each time.

Figure 5:
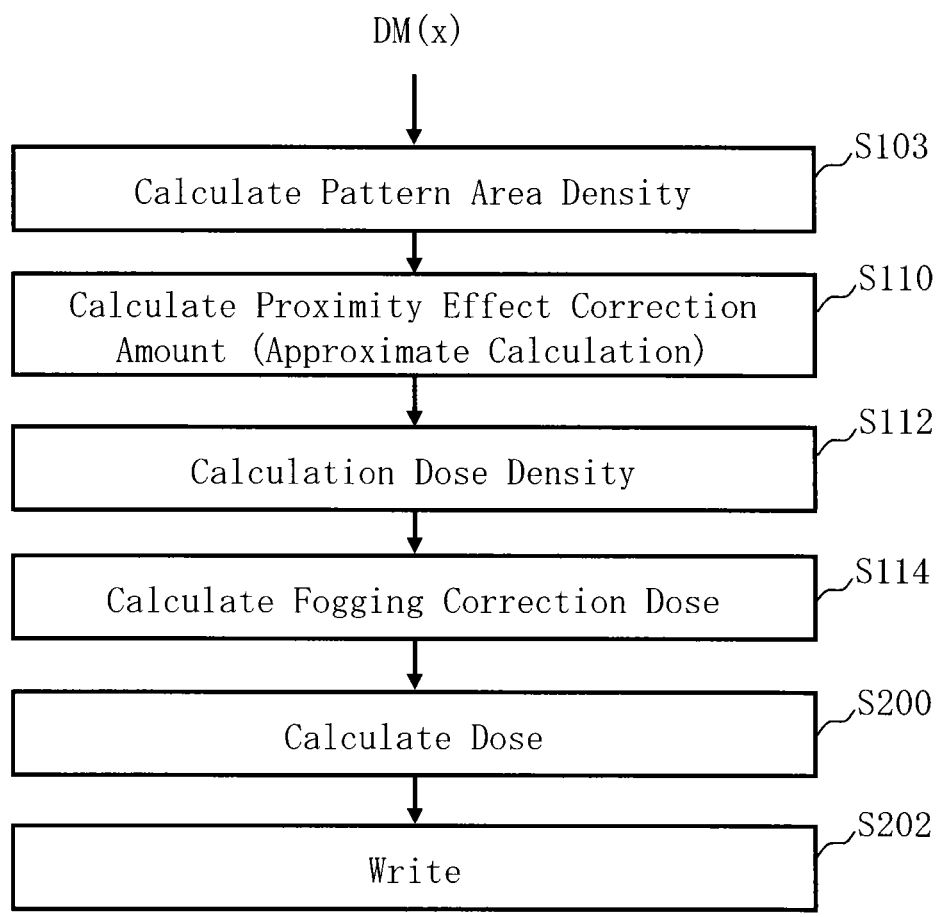
FIG. 5 is a flowchart showing main steps of a writing method according to the second embodiment.

FIG. 5 is a flowchart showing the main steps of a writing method according to the second embodiment. In the second embodiment, similarly to the first embodiment, there is performed dose calculation for correcting the fogging effect in the writing apparatus 100 by using a dose modulation value DM in which an amount of correction of the proximity effect has previously been included.

In an area density calculation step (S103), the area density calculation unit 10 calculates a pattern area density ρ(x). The area density ρ(x) here is used for calculating a proximity effect correction dose coefficient $D_p(x)$ which is to be used for calculating a fogging correction dose coefficient $D_f(x)$. Therefore, the area density ρ(x) is calculated in the size of a proximity effect mesh for fogging effect calculation. The area density calculation unit 10 virtually divides the writing region into a plurality of mesh regions of a predetermined size. It is preferable for the mesh size to be smaller than the size of a global region and larger than the mesh size used for an original calculation for proximity effect correction. For example, it is preferable for the mesh size to be about several times of 1/10 of the influence radius of the proximity effect. For example, it is preferable to be about 5 to 10 μm. Thereby, the number of times of calculation can be reduced compared with a particular correction calculation for a proximity effect correction which is performed for each mesh region of the size of about 1/10 of the influence radius of the proximity effect. Eventually, it becomes possible to perform calculation at high speed. Other contents of the calculation method for the area density ρ(x) are the same as those of the weighted area density calculation step (S102) according to the first embodiment.

In a proximity effect correction dose coefficient calculation step (S110), the proximity effect correction dose coefficient calculation unit 16 calculates a proximity effect correction dose coefficient $D_p(x)$ for fogging effect calculation that corrects a dimension variation due to a proximity effect, by using an area density ρ(x). The proximity effect correction dose coefficient $D_p(x)$ can be obtained by solving the following equation (4) using a proximity effect correction coefficient (backscatter coefficient) η, a distribution function $g_p(x)$, and an area density. ρ(x).

$$\frac{D_p(x)}{2} + \eta \int D_p(x')g_p(x-x')\rho(x')dx' = \frac{1}{2} + \eta \quad (4)$$

In a dose density calculation step (S112), the dose density calculation unit 18 calculates a dose density $\rho^+(x)$ by using an area density ρ(x) and a proximity effect correction dose coefficient $D_p(x)$ for fogging effect calculation. The dose density $\rho^+(x)$ can be obtained by solving the following equation (5).

$$\rho^+(x) = D_p(x) \cdot \rho(x) \quad (5)$$

In a fogging correction dose coefficient calculation step (S114), the fogging correction dose coefficient calculation unit 14 calculates a fogging correction dose coefficient $D_f(x)$ that corrects a dimension variation due to a fogging effect, by using a pattern area density ρ(x). The fogging correction dose coefficient $D_f(x)$ can be obtained by solving the following equation (6) using a proximity effect correction coefficient (backscatter coefficient) η, a fogging correction coefficient θ, a distribution function $g_f(x)$, and a dose density $\rho^+(x)$.

$$D_f(x) + \frac{\theta}{1/2+\eta} \int D_f(x')\rho^+(x')g_f(x-x')dx' = 1 \qquad (6)$$

The fogging correction dose coefficient $D_f(x)$ calculated as described above is output to the control calculator 110.

In a dose calculation step (S200), the dose calculation unit 113 calculates a dose $D(x)$ of the electron beam 200 by using a fogging correction dose coefficient $D_f(x)$ and a dose modulation value $DM(x)$. The dose $D(x)$ can be calculated by the equation (3) described above, using a fogging correction dose coefficient $D_f(x)$, a dose modulation value $DM(x)$, and a base dose $D_B(x)$.

Since an amount of correction of a proximity effect has already been included in the dose modulation value $DM(x)$, the dose $D(x)$ indicates a dose for correcting both a dimension variation due to the proximity effect and a dimension variation due to the fogging effect.

Hereafter, the writing step (S202) is the same as that of the first embodiment. The contents of the second embodiment are the same as those of the first embodiment except what is particularly described.

As described above, according to the second embodiment, when inputting a dose modulation value including an amount of correction of a proximity effect from the outside of the apparatus, a correction calculation can also be performed for a fogging effect. Therefore, both a dimension variation due to the proximity effect and a dimension variation due to the fogging effect can be corrected.

Third Embodiment

In the first and second embodiments, there has been described correction of a fogging effect. In the third embodiment, there will be described correction of a loading effect.

Figure 6:
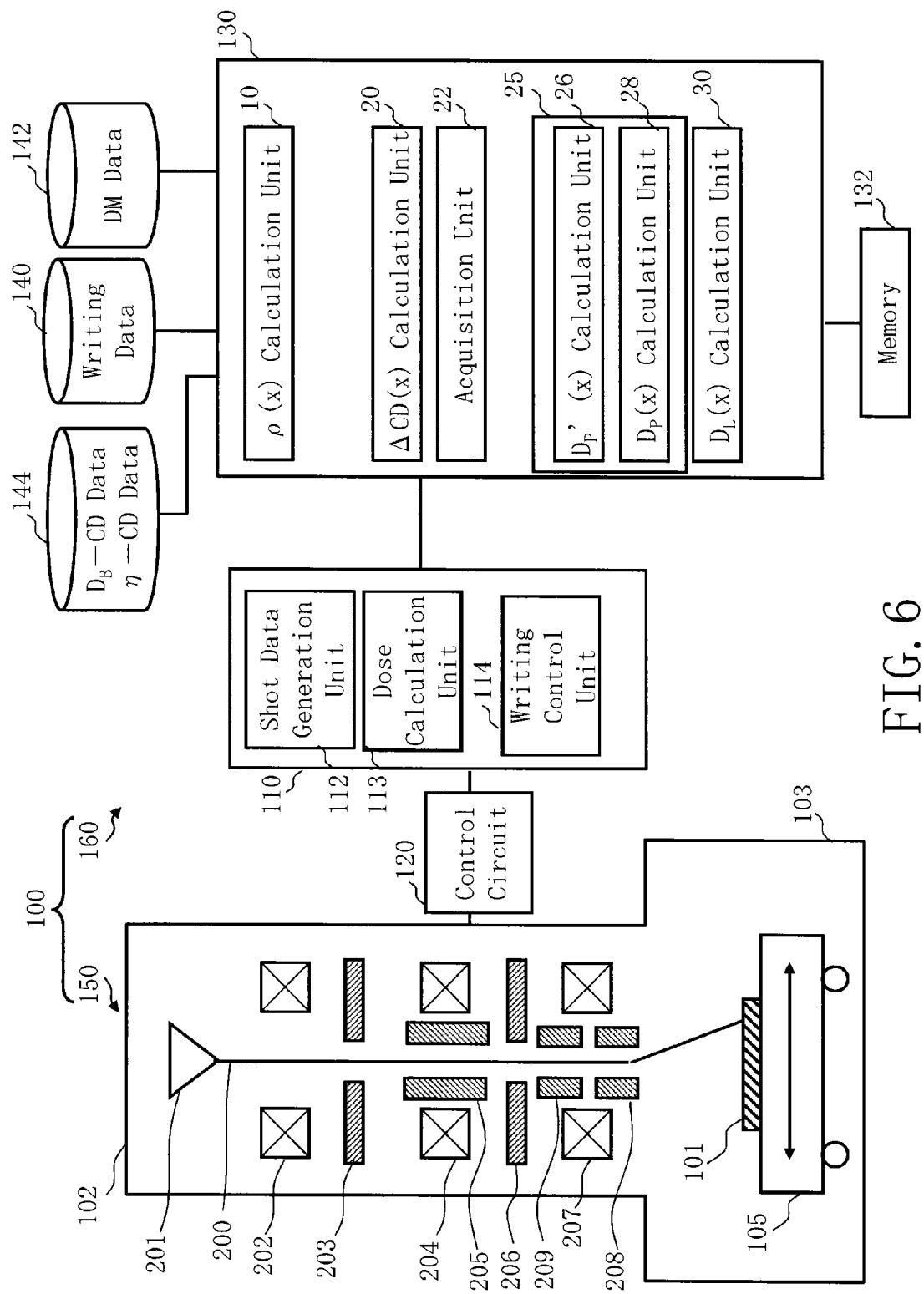
FIG. 6 is a schematic diagram showing a configuration of a writing apparatus according to the third embodiment.

FIG. 6 is a schematic diagram showing the configuration of a writing apparatus according to the third embodiment. FIG. 6 is the same as FIG. 1 except that an area density calculation unit 10, a dimension variation amount calculation unit 20, an acquisition unit 22, a proximity effect correction dose coefficient calculation unit 25, and a loading effect correction dose coefficient calculation unit 30 are further added in the preprocessing computer 130, the proximity effect correction dose coefficient calculation unit 25 includes proximity effect correction dose coefficient calculation units 26 and 28, the weighted area density calculation unit 12 and the fogging correction dose coefficient calculation unit 14 are removed from the preprocessing computer 130, and a storage device 144 such as a magnetic disk drive is added.

Functions, such as the area density calculation unit 10, the dimension variation amount calculation unit 20, the acquisition unit 22, the proximity effect correction dose coefficient calculation units 26 and 28, and the loading effect correction dose coefficient calculation unit 30 may be configured by hardware such as an electric circuit, or by software such as a program causing a computer to implement these functions. Alternatively, they may be configured by a combination of software and hardware. Data which is input and output to/from the area density calculation unit 10, the dimension variation amount calculation unit 20, the acquisition unit 22, the proximity effect correction dose coefficient calculation units 26 and 28, or the loading effect correction dose coefficient calculation unit 30 and data being calculated are stored in the memory 132 each time.

Correlation data $\eta$-CD indicating correlation between a proximity effect correction coefficient $\eta$ and a pattern dimension CD, and correlation data $D_B$-CD indicating correlation between a base dose $D_B$ and a pattern dimension CD are input into the storage device 144 from the outside and stored therein.

Figure 7:
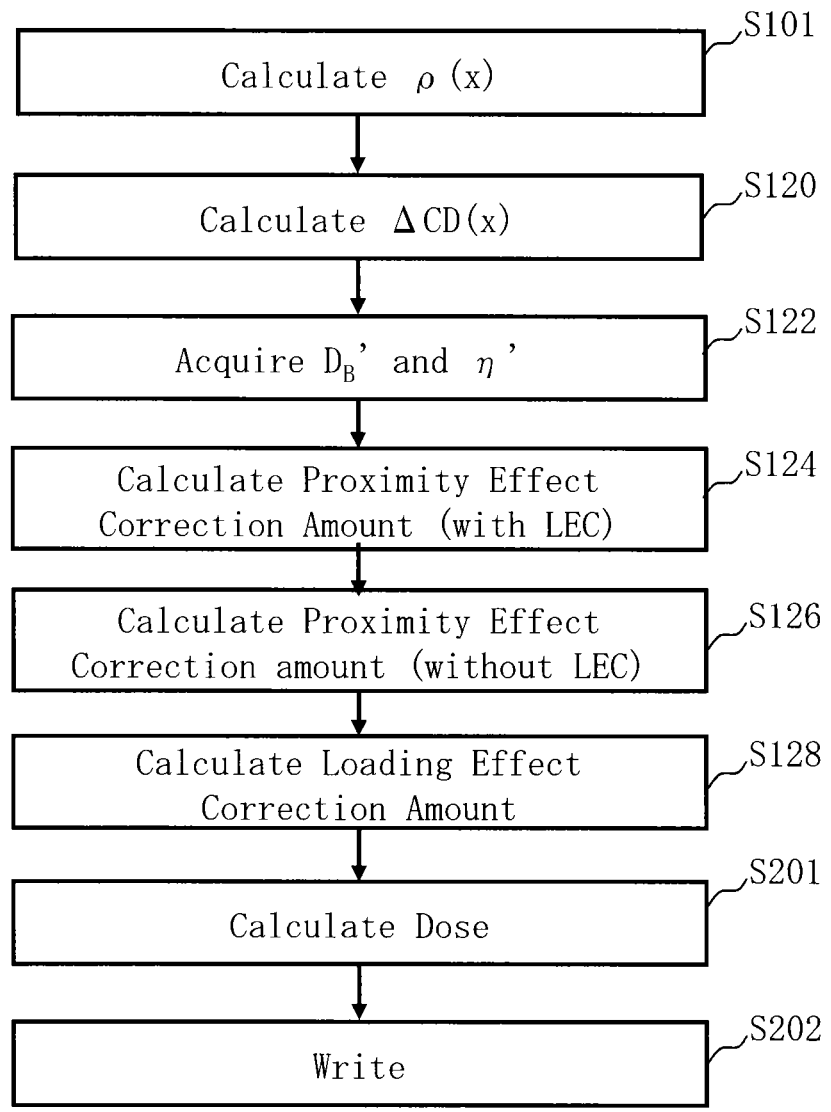
FIG. 7 is a flowchart showing main steps of a writing method according to the third embodiment.

FIG. 7 is a flowchart showing the main steps of a writing method according to the third embodiment. In the third embodiment, dose calculation for correcting a loading effect is performed in the writing apparatus 100 by using a dose modulation value DM in which the amount of correction of the proximity effect has been included.

In an area density calculation step (S101), the area density calculation unit 10 calculates a pattern area density $\rho(x)$. Specifically, the calculation is performed, for example, as follows. The area density calculation unit 10 first virtually divides the writing region into a plurality of mesh regions of a predetermined size. It is preferable for the mesh size to be, for example, about 1/10 of the influence radius of the loading effect, as the size of a global region, and specifically, to be about 100 to 500 µm, for example.

Then, the area density calculation unit 10 inputs writing data from the storage device 140, and calculates, for each mesh region, an area density $\rho(x)$ of a figure pattern arranged in the mesh region.

In a dimension variation amount calculation step (S120), the dimension variation amount calculation unit 20 calculates a dimension variation amount $\Delta CD(x)$ due to a loading effect by using a pattern area density $\rho(x)$ of each mesh region obtained by virtually dividing the writing region into a plurality of mesh regions. The dimension variation amount $\Delta CD(x)$ can be obtained by solving the following equation (7).

$$\Delta CD = \gamma \int \rho(x')g_L(x-x')dx' + P(x) \qquad (7)$$

Here, a loading effect correction coefficient $\gamma$ is defined by a dimension variation amount of the area density of 100%. Moreover, $g_L(x)$ indicates a distribution function in the loading effect. $P(x)$ indicates a dimension variation amount depending upon positions. Data stored in a storage device (not shown) can be used as the dimension variation amount $P(x)$ depending upon positions.

In an acquisition step (S122), the acquisition unit 22 reads the correlation data $\eta$-CD and the correlation data $D_B$-CD from the storage device 144 and acquires a group of a base dose $D_B'$ and a proximity effect correction coefficient (backscatter coefficient) $\eta'$ suitable for correcting even a dimension variation amount $\Delta CD(x)$ due to a loading effect while maintaining proximity effect correction. A group of $\eta'$ and $D_B'$ suitable for CD obtained by adding (or subtracting) a dimension variation amount $\Delta CD(x)$ to a desired CD should be acquired from the correlation data $\eta$-CD and the correlation data $D_B$-CD. When a base dose $D_B$ and a proximity effect correction coefficient $\eta$ that does not take account of a loading effect are not preset, a group of $\eta$ and $D_B$ is further acquired in addition to the above group.

In a calculation step (S124) of a proximity effect correction dose coefficient (also referred to as a proximity effect correction dose, which applies hereinafter), the proximity effect correction dose coefficient calculation unit 26 calculates a proximity effect correction dose coefficient $Dp'(x)$ for correcting a proximity effect while correcting a dimension variation due to a loading effect, by using an acquired proximity effect correction coefficient $\eta'$ and an area density $\beta(x)$. The proximity effect correction dose coefficient $D_p'(x)$ can be obtained by solving the following equation (8).

$$\frac{D'_p(x)}{2} + \eta' \int D'_p(x')g_p(x-x')\rho(x')dx' = \frac{1}{2} + \eta' \qquad (8)$$

Here, $g_p(x)$ indicates a distribution function (back scattering influence function) in a proximity effect. Calculation is performed for each mesh region which is obtained by virtually dividing the chip region of a chip serving as a writing target into a plurality of mesh regions. It is preferable for the size of a mesh region to be, for example, about 1/10 of the influence radius of the proximity effect, and specifically, to be about 1 µm, for example.

In a proximity effect correction dose coefficient calculation step (S126), the proximity effect correction dose coefficient calculation unit 28 calculates a proximity effect correction dose coefficient $D_p(x)$ for correcting a proximity effect without performing correction of a loading effect, by using an area density $\rho(x)$ and a proximity effect correction coefficient η in the group of a base dose $D_B$ and the proximity effect correction coefficient η that does not take account of a loading effect. The proximity effect correction dose coefficient $D_p(x)$ can be obtained by solving the following equation (9).

$$\frac{D_p(x)}{2} + \eta \int D_p(x')g_p(x-x')\rho(x')dx' = \frac{1}{2} + \eta \qquad (9)$$

This calculation is also performed for each mesh region. It is preferable for the size of a mesh region to be, for example, about 1/10 of the influence radius of the proximity effect, and specifically, to be about 1 µm, for example.

In a calculation step (S128) of a loading effect correction dose coefficient (also referred to as a loading effect correction dose, which applies hereinafter), the loading effect correction dose coefficient calculation unit 30 calculates a loading effect correction dose coefficient $D_L(x)$ by using a proximity effect correction dose coefficient $D_p'(x)$ that takes account of loading effect correction and a proximity effect correction dose coefficient $D_p(x)$ that does not take account of a loading effect. The loading effect correction dose coefficient $D_L(x)$ can be obtained by solving the following equation (10) by using a base dose $D_B$ in the group of the base dose $D_B$ and a proximity effect correction coefficient n that does not take account of a loading effect, a base dose $D_B'$ in the group of the base dose $D_B'$ and a proximity effect correction coefficient n' that takes account of a loading effect, a proximity effect correction dose coefficient $D_p'(x)$ that takes account of loading effect correction, and a proximity effect correction dose coefficient $D_p(x)$ that does not take account of a loading effect.

$$D_L(x) = \frac{D_B' D_p'(x)}{D_B D_p(x)} \qquad (10)$$

In a dose calculation step (S201), the dose calculation unit 113 calculates a dose $D(x)$ of the electron beam 200 by using a loading effect correction dose coefficient $D_L(x)$ and a dose modulation value $DM(x)$. The dose $D(x)$ can be obtained by solving the following equation (11) using the loading effect correction dose coefficient $D_L(x)$, the dose modulation value $DM(x)$, and a base dose $D(x)$.

$$D(x) = D_B(x) \cdot D_L(x) \cdot DM(x) \qquad (11)$$

Since an amount of correction of a proximity effect has already been included in the dose modulation value $DM(x)$, the dose $D(x)$ indicates a dose for correcting both a dimension variation due to the proximity effect and a dimension variation due to the loading effect.

The writing step (S202) is the same as that of the first embodiment. The contents of the third embodiment are the same as those of the first embodiment except what is particularly described.

As described above, according to the third embodiment, when inputting a dose modulation value including an amount of correction of a proximity effect from the outside of the apparatus, correction calculation can also be performed for a loading effect. Therefore, both a dimension variation due to the proximity effect and a dimension variation due to the loading effect can be corrected.

Fourth Embodiment

In the fourth embodiment, there will be described a configuration in which correction of a loading effect is performed using a loading effect correction table (LEC table).

Figure 8:
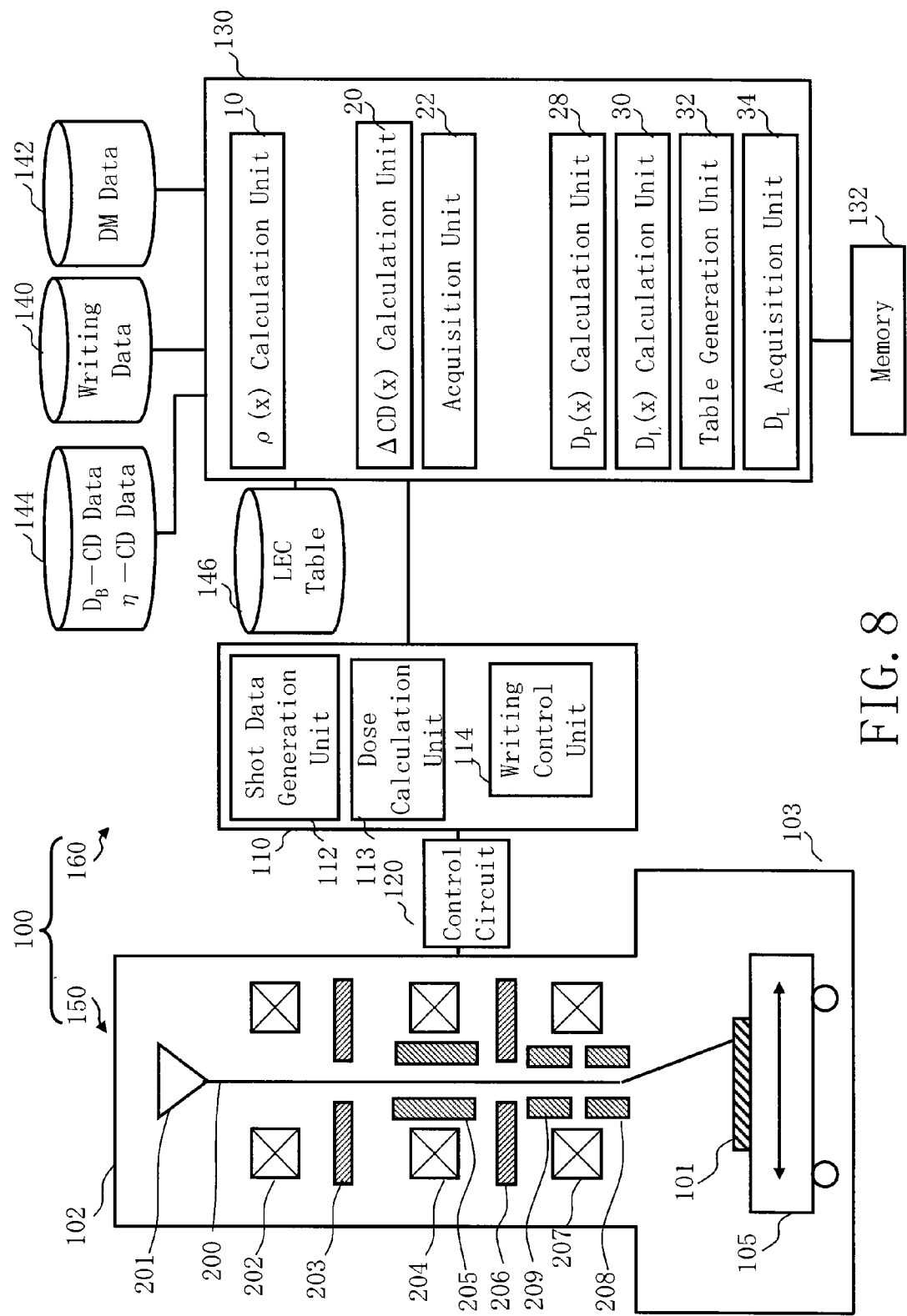
FIG. 8 is a schematic diagram showing a configuration of a writing apparatus according to the fourth embodiment.

FIG. 8 is a schematic diagram showing the configuration of a writing apparatus according to the fourth embodiment. FIG. 8 is the same as FIG. 6 except that a table generation unit 32 and a loading effect correction dose coefficient acquisition unit 34 are further added in the preprocessing computer 130, and the proximity effect correction dose coefficient calculation unit 26 is removed from the preprocessing computer 130, and a storage device 146 such as a magnetic disk drive is added.

Functions, such as the area density calculation unit 10, the dimension variation amount calculation unit 20, the acquisition unit 22, the proximity effect correction dose coefficient calculation unit 28, the loading effect correction dose coefficient calculation unit 30, the table generation unit 32, and the loading effect correction dose coefficient acquisition unit 34 may be configured by hardware such as an electric circuit, or by software such as a program causing a computer to implement these functions. Alternatively, they may be configured by a combination of software and hardware. Data which is input and output to/from the area density calculation unit 10, the dimension variation amount calculation unit 20, the acquisition unit 22, the proximity effect correction dose coefficient calculation unit 28, the loading effect correction dose coefficient calculation unit 30, the table generation unit 32, or the loading effect correction dose coefficient acquisition unit 34, and data being calculated are stored in the memory 132 each time.

Figures 9, 10:
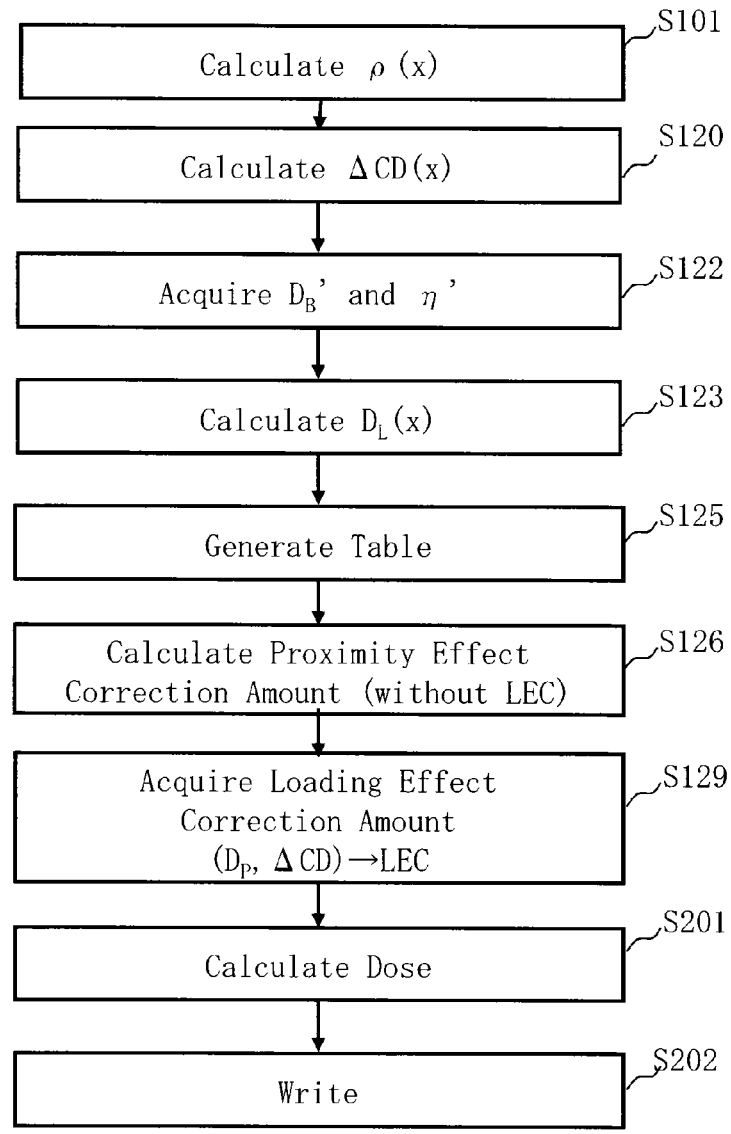
FIG. 9 is a flowchart showing main steps of a writing method according to the third embodiment.
FIG. 10 shows an example of an LEC table according to the fourth embodiment.

FIG. 9 is a flowchart showing the main steps of a writing method according to the fourth embodiment. In the fourth embodiment, dose calculation for correcting a loading effect is performed in the writing apparatus 100 by using a dose modulation value DM in which the amount of correction of the proximity effect has been included.

The area density calculation step (S101), the dimension variation amount calculation step (S120), and the acquisition step (S122) are executed. The content of processing of each step is the same as that of the third embodiment.

In a loading effect correction dose coefficient calculation step (S123), the loading effect correction dose coefficient calculation unit 30 calculates a loading effect correction dose coefficient $D_L(x)$ by using a proximity effect correction dose coefficient $D_p^{(1)'}(x)$ that takes account of loading effect correction and a proximity effect correction dose coefficient $D_p^{(1)}(x)$ that does not take account of a loading effect. The loading effect correction dose coefficient $D_L(x)$ can be obtained by solving the following equation (12).

$$D_L(x) = \frac{D'_B D_p^{(1)\prime}(x)}{D_B D_p^{(1)}(x)} \quad (12)$$

The proximity effect correction dose coefficient $D_p^{(1)\prime}(x)$ that takes account of loading effect correction is defined by the following equation (13).

$$D_p^{(1)\prime}(x) = \frac{\frac{1}{2} + \eta'}{\frac{1}{2} + \eta' \int g_P(x-x')\rho(x')dx'} \quad (13)$$

The proximity effect correction dose coefficient $D_p^{(1)}(x)$ that does not take account of loading effect correction is defined by the following equation (14).

$$D_p^{(1)}(x) = \frac{\frac{1}{2} + \eta}{\frac{1}{2} + \eta \int g_P(x-x')\rho(x')dx'} \quad (14)$$

As shown in the equation (12), the loading effect correction dose coefficient $D_L(x)$ is defined by a value obtained by dividing a product (first product) by another product (second product), where the first product is calculated by multiplying a base dose $D_B'$ (first base dose) that corrects a dimension variation amount due to a loading effect while maintaining correction of a proximity effect by a proximity effect correction dose coefficient $D_p^{(1)\prime}(x)$ (first proximity effect correction dose coefficient) obtained by using a proximity effect correction coefficient $\eta'$ (first proximity effect correction coefficient) being grouped with the base dose $D_B'$, and the second product is calculated by multiplying a base dose $D_B$ (second base dose) that corrects a dimension variation amount due to a proximity effect without performing correction of a dimension variation amount due to a loading effect by a proximity effect correction dose coefficient $D_p^{(1)}(x)$ (second proximity effect correction dose coefficient) obtained by using a proximity effect correction coefficient (second proximity effect correction coefficient) being grouped with the base dose $D_B$.

In the equations (13) and (14), the proximity effect correction dose coefficient $D_p^{(1)\prime}(x)$ and the proximity effect correction dose coefficient $D_p^{(1)}(x)$ can be variable by making the area density $\rho(x)$ variable. Then, a loading effect correction dose coefficient $D_L(x)$ is calculated in each of a varied proximity effect correction dose coefficient $D_p^{(1)\prime}(x)$ and a varied proximity effect correction dose coefficient $D_p^{(1)}(x)$. In that case, it is preferable for the area density $\rho(x)$, not to be various values unnecessarily, but to be a value used when calculating the dimension variation amount $\Delta CD(x)$ in the dimension variation amount calculation step (S120). Thereby, the loading effect correction dose coefficient $D_L(x)$ and the proximity effect correction dose coefficient $D_p^{(1)}(x)$ can be calculated with respect to the area density $\rho(x)$ corresponding to an actual pattern.

In the equation (13), a proximity effect correction coefficient $\eta'$ that takes account of correction of a loading effect is used. In the equation (14), a proximity effect correction coefficient $\eta$ that does not take account of correction of a loading effect is used.

In the equations (13) and (14), $g_p(x)$ indicates a distribution function (back scattering influence function) in a proximity effect.

In a table generation step (S125), the table generation unit 32 generates a correlation table (LEC table) in which a loading effect correction dose coefficient $D_L(x)$, a proximity effect correction dose coefficient $D_p(x)$ that does not take account of correction of a loading effect, and a dimension variation amount $\Delta CD(x)$ are mutually correlated.

FIG. 10 shows an example of an LEC table according to the fourth embodiment. In FIG. 10, for example, for each varied area density $\rho(x)$, a corresponding loading effect correction dose coefficient $D_L(x)$, a proximity effect correction dose coefficient $D_p(x)$ that does not take account of correction of a loading effect, and a dimension variation amount $\Delta CD(x)$ are defined in the LEC table. The generated LEC table is stored in the storage device 146.

In a proximity effect correction dose coefficient calculation step (S126), the proximity effect correction dose coefficient calculation unit 28 calculate a proximity effect correction dose coefficient $D_p(x)$ that corrects a dimension variation due to a proximity effect, by using a pattern area density $\rho(x)$. Specifically, a proximity effect correction dose coefficient $D_p(x)$ for correcting a proximity effect without performing correction of a loading effect is calculated using an area density $\rho(x)$ and a proximity effect correction coefficient $\eta$ in the group of the base dose $D_B$ and the proximity effect correction coefficient n that does not take account of a loading effect. The proximity effect correction dose coefficient $D_p(x)$ can be obtained by solving the following equation (15).

$$\frac{D_p(x)}{2} + \eta \int D_p(x')g_p(x-x')\rho(x')dx' = \frac{1}{2} + \eta \quad (15)$$

Calculation is performed for each mesh region which is obtained by virtually dividing the chip region of a chip serving as a writing target into a plurality of mesh regions. It is preferable for the size of a mesh region to be, for example, about 1/10 of the influence radius of the proximity effect, and specifically, to be about 1 μm, for example.

In a loading effect correction dose coefficient acquisition step (S129), the loading effect correction dose coefficient acquisition unit 34 acquires a loading effect correction dose coefficient $D_L(x)$ which corresponds to a calculated dimension variation amount $\Delta CD(x)$ due to a loading effect and a calculated proximity effect correction dose coefficient $D_p(x)$, by using the correlation of the loading effect correction dose coefficient that corrects a dimension variation due to a loading effect, the proximity effect correction dose coefficient that corrects a dimension variation due to a proximity effect, and the dimension variation amount due to a loading effect. Specifically, a loading effect correction dose coefficient $D_L(x)$ which corresponds to a calculated dimension variation amount $\Delta CD(x)$ and a calculated proximity effect correction dose coefficient $D_p(x)$ is acquired by referring to the LEC table stored in the storage device 146.

In a dose calculation step (S201), the dose calculation unit 113 calculates a dose $D(x)$ of the electron beam 200 by using a loading effect correction dose coefficient $D_L(x)$ and a dose modulation value $DM(x)$. The dose $D(x)$ can be obtained by solving the equation (11) described above.

Since an amount of correction of the proximity effect has already been included in the dose modulation value DM(x), the dose D(x) indicates a dose for correcting both a dimension variation due to the proximity effect and a dimension variation due to the loading effect.

The writing step (S202) of the fourth embodiment is the same as that of the first embodiment (or the third embodiment). The contents of the fourth embodiment are the same as those of the first embodiment (or the third embodiment) except what is particularly described.

As described above, according to the fourth embodiment, when inputting a dose modulation value including an amount of correction of a proximity effect from the outside of the apparatus, correction calculation can also be performed for a loading effect. Therefore, both a dimension variation due to the proximity effect and a dimension variation due to the loading effect can be corrected.

Fifth Embodiment

In the fifth embodiment, there will be described a configuration in which an LEC table is generated by a different method from that of the fourth embodiment.

Figure 11:
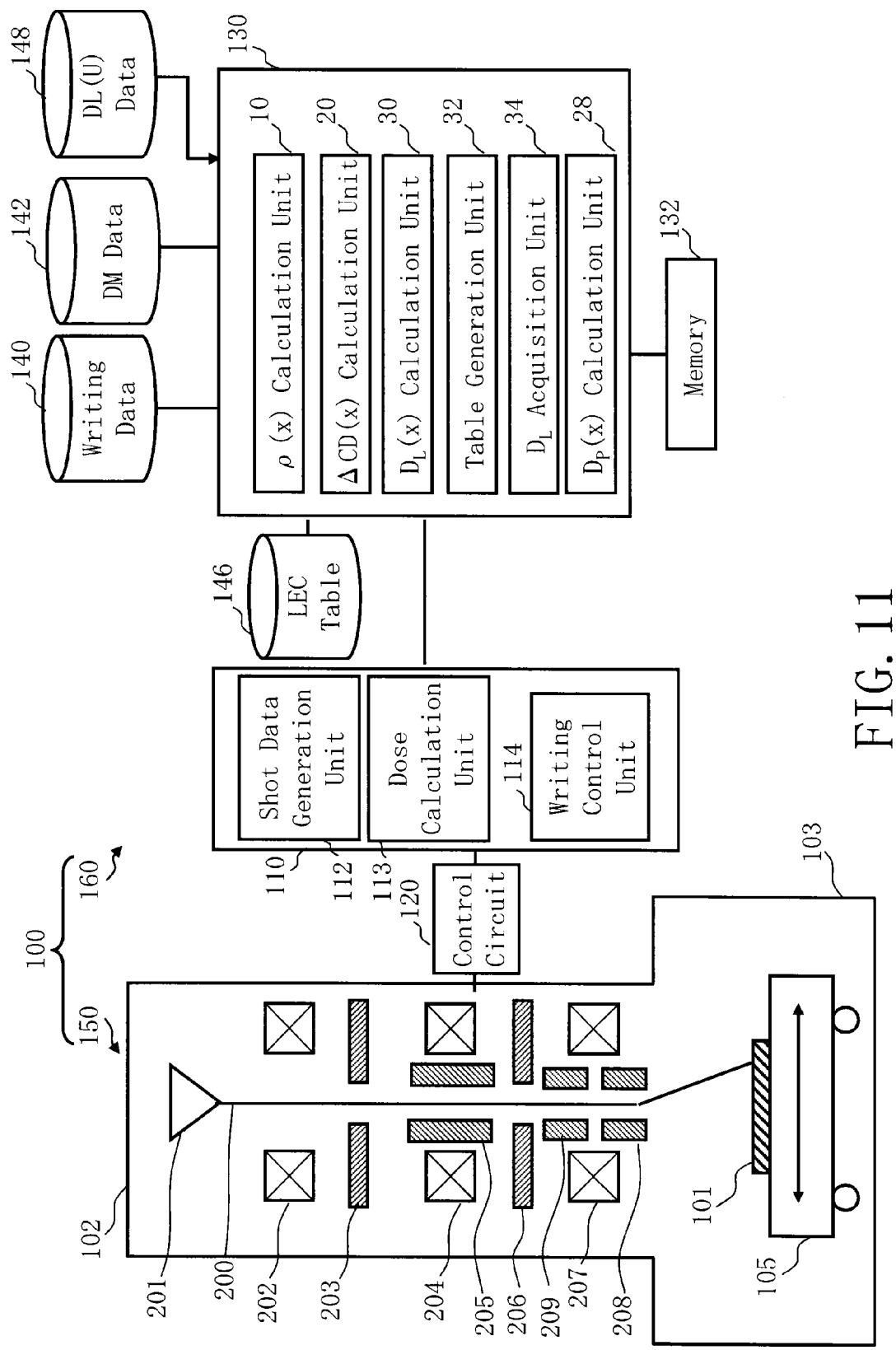
FIG. 11 is a schematic diagram showing a configuration of a writing apparatus according to the fifth embodiment.

FIG. 11 is a schematic diagram showing the configuration of a writing apparatus according to the fifth embodiment. FIG. 11 is the same as FIG. 8 except that the acquisition unit 22 is removed from the preprocessing computer 130, and a storage device 148 such as a magnetic disk drive is provided instead of the storage device 144 such as a magnetic disk drive.

Functions, such as the area density calculation unit 10, the dimension variation amount calculation unit 20, the proximity effect correction dose coefficient calculation unit 28, the loading effect correction dose coefficient calculation unit 30, the table generation unit 32, and the loading effect correction dose coefficient acquisition unit 34 may be configured by hardware such as an electric circuit, or by software such as a program causing a computer to implement these functions. Alternatively, they may be configured by a combination of software and hardware. Data which is input and output to/from the area density calculation unit 10, the dimension variation amount calculation unit 20, the loading effect correction dose coefficient calculation unit 30, the table generation unit 32, or the loading effect correction dose coefficient acquisition unit 34, and data being calculated are stored in the memory 132 each time.

In the storage device 148, there is stored dose latitude DL(U) data. The dose latitude DL(U) data is a value depending on a proximity effect density U(x). First, correlation data between a pattern dimension CD and a dose D is acquired by experiment, for each proximity effect density U. The proximity effect density U(x) is defined by a value obtained by convolving a pattern area density ρ(x) in a mesh region for proximity effect with a distribution function g(x), in the range larger than the influence range of the proximity effect. It is preferable that a Gaussian function, for example, is used as the distribution function g(x). It is preferable for the mesh size of a mesh region for a proximity effect to be, for example, about 1/10 of the influence radius of the proximity effect, and specifically, to be about 1 μm, for example. The dose latitude DL(U) depends upon a proximity effect density U(x), and is defined, for example, by the gradient (proportionality coefficient) of the graph of CD-D(U) for each proximity effect density U(x). Thus, the dose latitude DL(U) indicates a relation between a pattern dimension CD and a dose D(U). For example, with respect to each case of the proximity effect density U(x)=0(0%), 0.5(50%) and 1(100%), the dimension CD of a pattern to be written with the electron beam, and the dose D(U) of the electron beam should be obtained by experiment. The dose latitude DL(U) can be acquired by performing fitting by a polynomial of a plurality of dose latitudes DL(Ui) obtained by experiment.

Figures 12, 13:
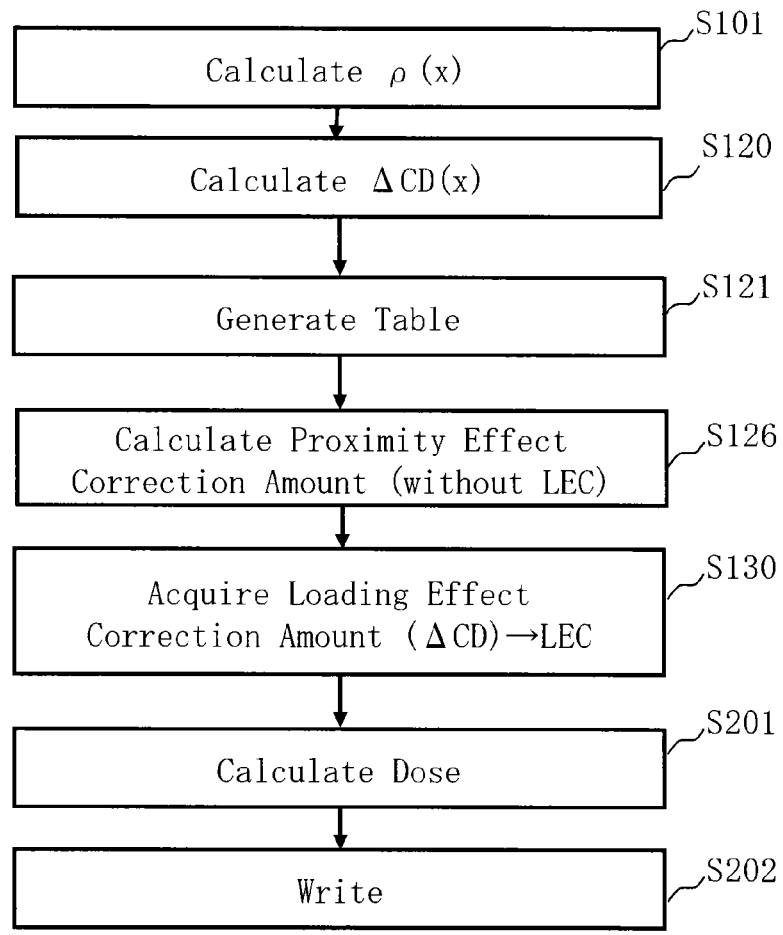
FIG. 12 is a flowchart showing main steps of a writing method according to the fifth embodiment.
FIG. 13 shows an example of an LEC table according to the fifth embodiment.

FIG. 12 is a flowchart showing the main steps of a writing method according to the fifth embodiment. In the fifth embodiment, dose calculation for correcting a loading effect is performed in the writing apparatus 100 by using a dose modulation value DM in which the amount of correction of the proximity effect has been included.

The area density calculation step (S101), the dimension variation amount calculation step (S120), and the acquisition step (S122) are executed. The content of processing of each step is the same as that of the third embodiment.

In a table generation step (S121), the table generation unit 32 generates a correlation table (LEC table) where a loading effect correction dose coefficient $D_L(x)$ that corrects a dimension variation due to a loading effect, a proximity effect correction dose coefficient $D_p(x)$ that does not take account of correction of a loading effect, and a dimension variation amount ΔCD(x) due to a loading effect are mutually correlated.

First, the loading effect correction dose coefficient calculation unit 30 calculates a loading effect correction dose coefficient $D_L(x)$ by using a dimension variation amount ΔCD(x) and a dose latitude DL(U). The loading effect correction dose coefficient $D_L(x)$ can be obtained by solving the following equation (16).

$$D_L(x) = \exp\left(\frac{-\Delta CD}{DL(U)}\right) \quad (16)$$

In the equation (16), the loading effect correction dose coefficient $D_L(x)$ is defined by a value where a term obtained by dividing a dimension variation amount ΔCD(x) due to a loading effect by a dose latitude DL(U) which is a coefficient indicating a relation between a pattern dimension CD and a dose D of an electron beam and which depends upon a proximity effect density U (x) is used as an exponential index (an index of Napier number e used as a base of a natural logarithm).

The proximity effect density U(x) is defined by the following equation (17) by using the distribution function g(x) and a pattern area density ρ(x) as described above.

$$U(x) = \int g_p(x-x')\rho(x')dx' \quad (17)$$

Relating U(x) with $D_p(x)$ of the LEC table described above is performed using the equation (14).

The loading effect correction dose coefficient calculation unit 30 makes an area density ρ(x) variable and calculates a loading effect correction dose coefficient $D_L(x)$ for each varied area density ρ(x).

FIG. 13 shows an example of an LEC table according to the fifth embodiment. In FIG. 13, for example, for each varied area density ρ(x), a corresponding loading effect correction dose coefficient $D_L(x)$, a dimension variation amount ΔCD(x), and a proximity effect correction dose coefficient $D_p(x)$ are defined in the LEC table. The generated LEC table is stored in the storage device 146. In that case, it is preferable for the area density ρ(x), not to be various values unnecessarily, but to be a value used when calculating the dimension variation amount ΔCD(x) in the dimension variation amount calculation step (S120). Thereby, the loading effect correction dose coefficient $D_L(x)$ can be calculated with respect to the area density $\rho(x)$ corresponding to an actual pattern.

In a proximity effect correction dose coefficient calculation step (S126), the proximity effect correction dose coefficient calculation unit 28 calculate a proximity effect correction dose coefficient $D_p(x)$ that corrects a dimension variation due to a proximity effect, by using a pattern area density $\rho(x)$. Specifically, a proximity effect correction dose coefficient $D_p(x)$ for correcting a proximity effect without performing correction of a loading effect is calculated using a proximity effect correction coefficient n that does not take account of a loading effect and an area density $\rho(x)$. The proximity effect correction dose coefficient $D_p(x)$ can be obtained by solving the equation (9) described above.

Calculation is performed for each mesh region which is obtained by virtually dividing the chip region of a chip serving as a writing target into a plurality of mesh regions. It is preferable for the size of a mesh region to be, for example, about 1/10 of the influence radius of the proximity effect, and specifically, to be about 1 μm, for example.

In a loading effect correction dose coefficient acquisition step (S130), the loading effect correction dose coefficient acquisition unit 34 acquires a loading effect correction dose coefficient $D_L(x)$ which corresponds to a calculated dimension variation amount $\Delta CD(x)$ due to a loading effect and a calculated proximity effect correction dose coefficient $D_p(x)$, by using the correlation of the loading effect correction dose coefficient that corrects a dimension variation due to a loading effect, the proximity effect correction dose coefficient that corrects a dimension variation due to a proximity effect, and the dimension variation amount due to a loading effect. Specifically, a loading effect correction dose coefficient $D_L(x)$ which corresponds to a calculated dimension variation amount $\Delta CD(x)$ and a calculated proximity effect correction dose coefficient $D_p(x)$ is acquired by referring to the LEC table stored in the storage device 146.

In a dose calculation step (S201), the dose calculation unit 113 calculates a dose $D(x)$ of the electron beam 200 by using a loading effect correction dose coefficient $D_L(x)$ and a dose modulation value $DM(x)$. The dose $D(x)$ can be obtained by solving the equation (11) described above.

Since an amount of correction of the proximity effect has already been included in the dose modulation value $DM(x)$, the dose $D(x)$ indicates a dose for correcting both a dimension variation due to the proximity effect and a dimension variation due to the loading effect.

The writing step (S202) of the fifth embodiment is the same as that of the first embodiment (or the third embodiment). The contents of the fifth embodiment are the same as those of the first embodiment (or the third embodiment) except what is particularly described.

As described above, according to the fifth embodiment, when inputting a dose modulation value including an amount of correction of a proximity effect from the outside of the apparatus, correction calculation can also be performed for a loading effect. Therefore, both a dimension variation due to the proximity effect and a dimension variation due to the loading effect can be corrected.

Sixth Embodiment

When performing resizing and proximity effect correcting by using a dose modulation value DM in order to improve a dose latitude DL, there may be a case where it is difficult to define the dose latitude DL as a function of a proximity effect density U. In other words, there is a case where the dose latitude DL is dependent upon a resizing amount or a DM amount. Therefore, in the sixth embodiment, there will be described a configuration in which the dose latitude DL is locally set to be used for correction of a loading effect.

Figure 14:
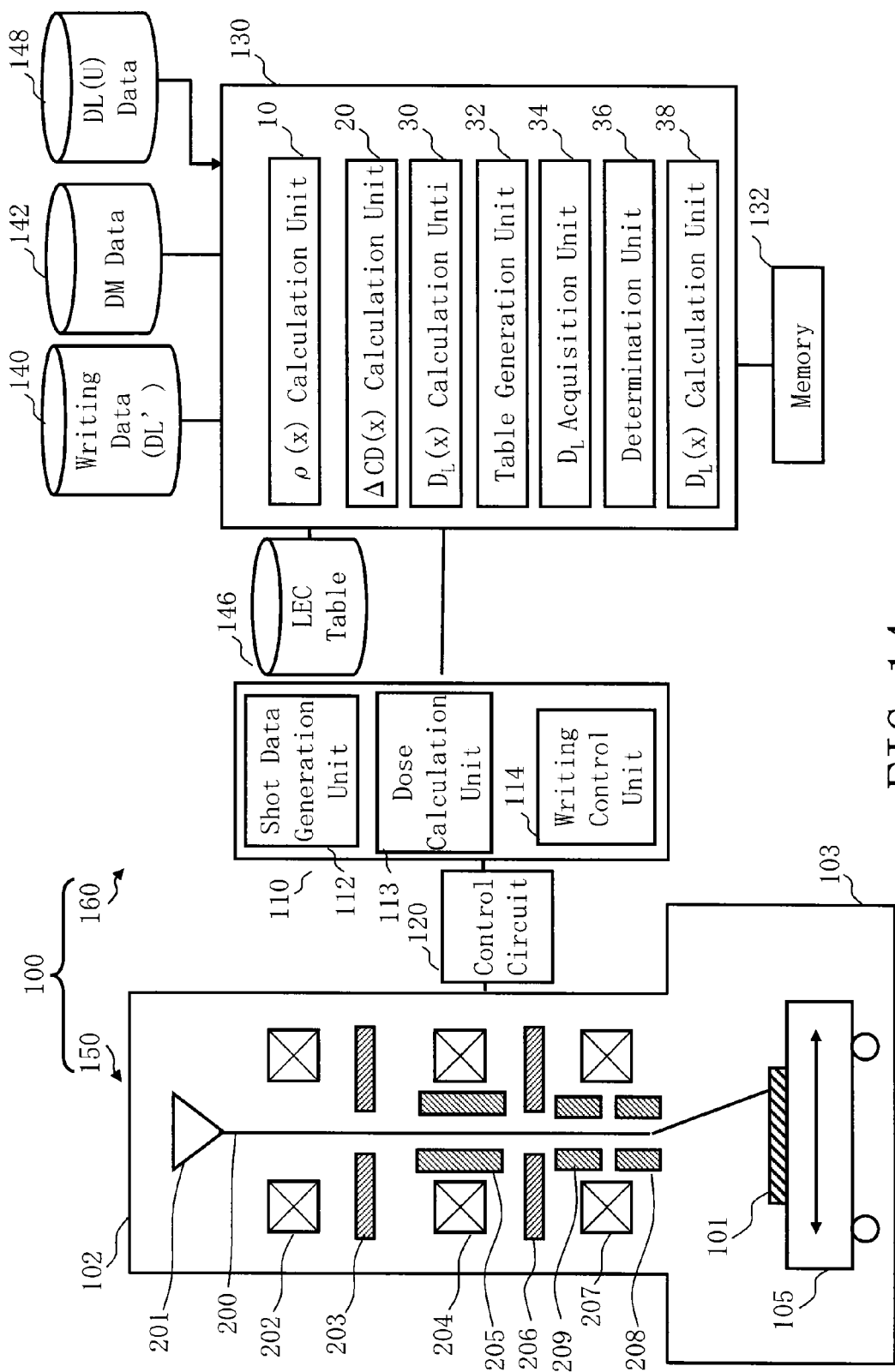
FIG. 14 is a schematic diagram showing a configuration of a writing apparatus according to the sixth embodiment.

FIG. 14 is a schematic diagram showing the configuration of a writing apparatus according to the sixth embodiment. FIG. 14 is the same as FIG. 11 except that a determination unit 36 and a loading effect correction dose coefficient calculation unit 38 are added in the preprocessing computer 130. However, a local dose latitude DL' which does not depend upon a proximity effect density U is defined, as attribute information, in pattern data of at least one figure pattern in a plurality of figure patterns defined in the writing data stored in the storage device 140.

Functions, such as the area density calculation unit 10, the dimension variation amount calculation unit 20, the loading effect correction dose coefficient calculation unit 30, the table generation unit 32, the loading effect correction dose coefficient acquisition unit 34, the determination unit 36, and the loading effect correction dose coefficient calculation unit 38 may be configured by hardware such as an electric circuit, or by software such as a program causing a computer to implement these functions. Alternatively, they may be configured by a combination of software and hardware. Data which is input and output to/from the area density calculation unit 10, the dimension variation amount calculation unit 20, the loading effect correction dose coefficient calculation unit 30, the table generation unit 32, the loading effect correction dose coefficient acquisition unit 34, the determination unit 36, or the loading effect correction dose coefficient calculation unit 38, and data being calculated are stored in the memory 132 each time.

Figure 15:
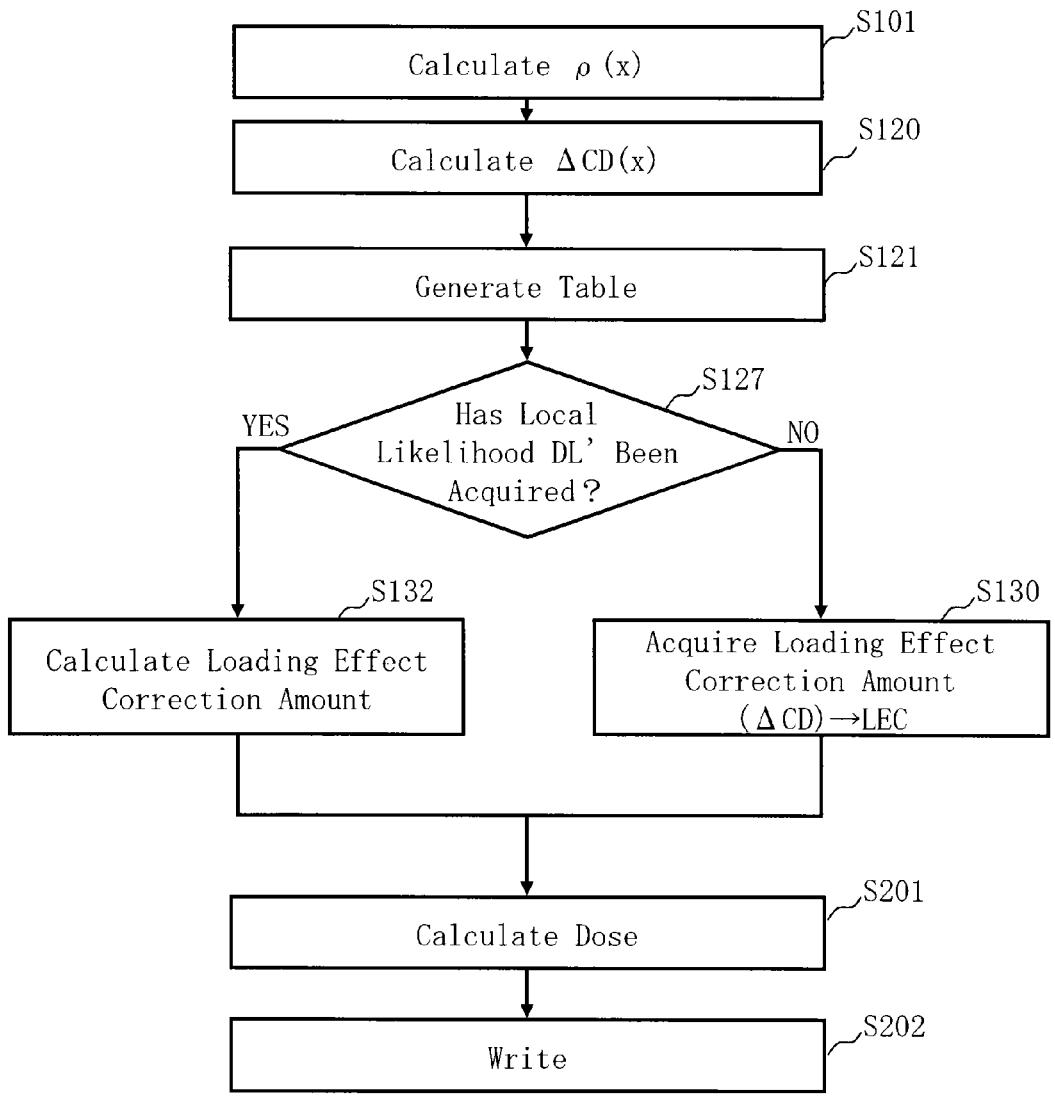
FIG. 15 is a flowchart showing main steps of a writing method according to the sixth embodiment.
Figure 16:
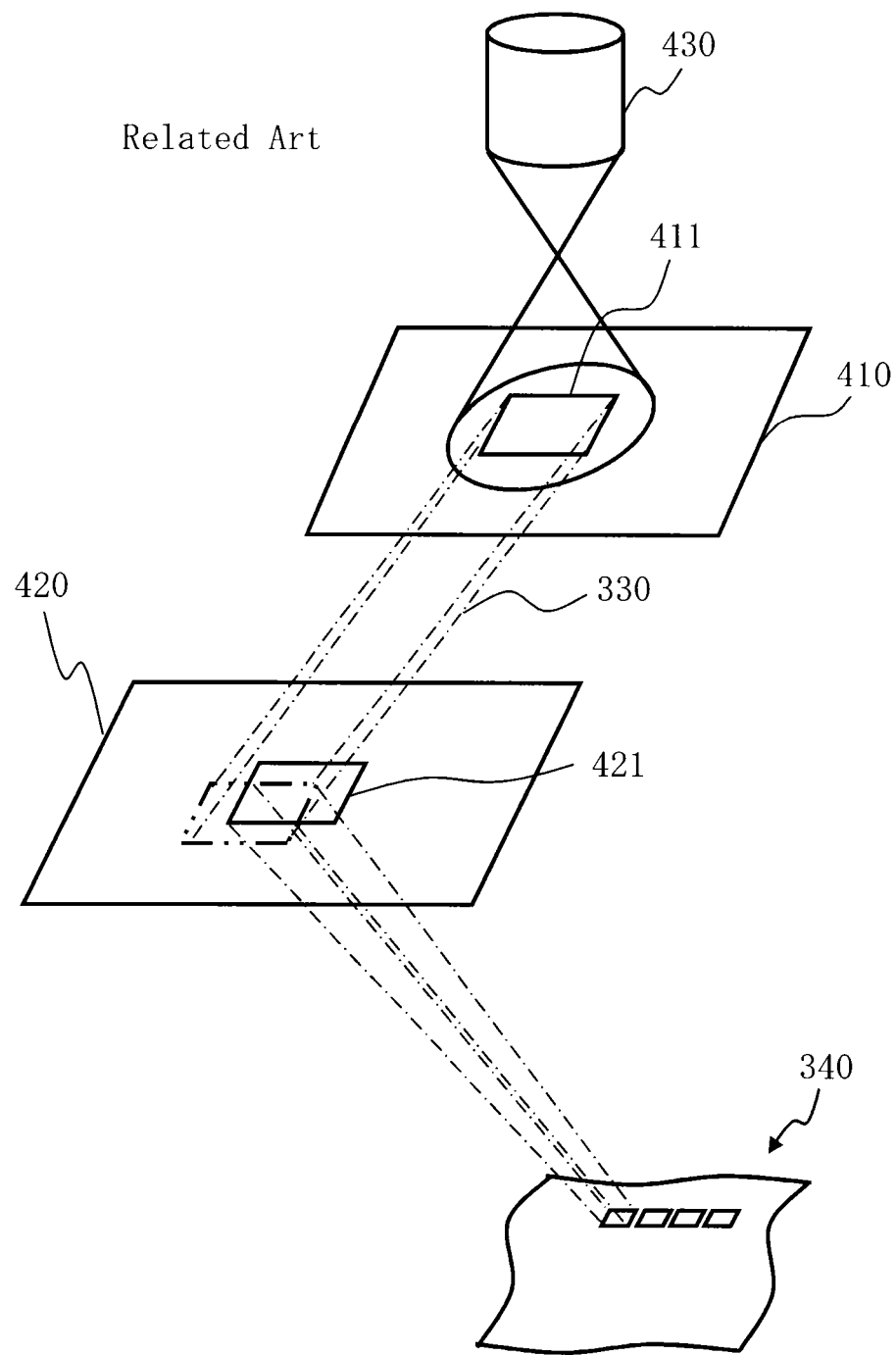
FIG. 16 is a conceptual diagram explaining operations of a variable shaping type electron beam writing apparatus.

FIG. 15 is a flowchart showing the main steps of a writing method according to the sixth embodiment. In the sixth embodiment, dose calculation for correcting a loading effect is performed in the writing apparatus 100 by using a dose modulation value DM in which the amount of correction of the proximity effect has been included.

The area density calculation step (S101), the dimension variation amount calculation step (S120), and a table generation step (S121) are executed. The content of processing of each step is the same as that of the fifth embodiment (or the third embodiment).

In a determination step (S127), the determination unit 36 determines whether a local dose latitude DL' is defined, as attribute information, for a figure pattern used as a calculation target. When the local dose latitude DL' has been defined, it proceeds to a loading effect correction dose coefficient calculation step (S132). When the local dose latitude DL' has not been defined, it proceeds to the loading effect correction dose coefficient acquisition step (S130).

When the local dose latitude DL' has not been defined, the loading effect correction dose coefficient acquisition step (S130) is executed. The contents of the loading effect correction dose coefficient acquisition step (S130) are the same as those of the fifth embodiment.

In a loading effect correction dose coefficient calculation step (S132), when the local dose latitude DL' has been defined, the loading effect correction dose coefficient calculation unit 38 calculates a loading effect correction dose coefficient $D_L(x)$ by using a local dose latitude DL'. The loading effect correction dose coefficient $D_L(x)$ can be obtained by solving the following equation (18).

$$D_L(x) = \exp\left(\frac{-\Delta CD}{DL'}\right) \quad (18)$$

In a dose calculation step (S201), the dose calculation unit 113 calculates a dose $D(x)$ of the electron beam 200 by using a loading effect correction dose coefficient $D_L(x)$ and a dose modulation value $DM(x)$. The dose $D(x)$ can be obtained by solving the equation (11) described above.

Since an amount of correction of the proximity effect has already been included in the dose modulation value $DM(x)$, the dose $D(x)$ indicates a dose for correcting both a dimension variation due to the proximity effect and a dimension variation due to the loading effect.

The writing step (S202) of the sixth embodiment is the same as that of the first embodiment (or the third embodiment). The contents of the sixth embodiment are the same as those of the first embodiment (or the third embodiment) except what is particularly described.

As described above, according to the sixth embodiment, when inputting a dose modulation value including an amount of correction of a proximity effect from the outside of the apparatus, correction calculation can also be performed for a loading effect. Therefore, both a dimension variation due to the proximity effect and a dimension variation due to the loading effect can be corrected. Moreover, a dimension variation due to a loading effect can be corrected by locally setting a dose latitude DL' and locally using the dose latitude DL' which is not dependent upon the proximity effect density U.

The embodiments have been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
    an external interface circuit configured to receive, from outside of the charged particle beam writing apparatus, a dose modulation value for each of a plurality of figure patterns to be written to a target object, each dose modulation value including an amount of correction of a dimension variation due to a proximity effect;
    an area density calculation unit configured to calculate a weighted pattern area density by
    virtually dividing a writing region of the target object into a plurality of mesh regions,
    calculating, for each of the plurality of mesh regions, an area density of each a plurality of figure patterns arranged in the mesh region,
    performing, for each figure pattern arranged in the mesh region, a weighting of the calculated area density for the mesh region based on the received dose modulation value for the corresponding figure pattern, and
    calculating the weighted pattern area density for each of the plurality of mesh regions as a sum of the weighted area density of each figure pattern in the mesh region;
    a fogging correction dose coefficient calculation unit configured to calculate a fogging correction dose coefficient for correcting a dimension variation due to a fogging effect by using the weighted pattern area density for each mesh region;
    a dose calculation unit configured to calculate a dose of a charged particle beam by using the fogging correction dose coefficient and the received dose modulation value; and
    a writing unit configured to write a pattern on the target object with the charged particle beam of the dose.

2. The apparatus according to claim 1, wherein the fogging correction dose coefficient calculation unit calculates the fogging correction dose coefficient by further using a proximity effect correction coefficient, a fogging correction coefficient, and a distribution function.

3. The apparatus according to claim 1, wherein the dose calculation unit calculates the dose by multiplying a base dose, the fogging correction dose coefficient, and the dose modulation value.

4. A charged particle beam writing method comprising:
    receiving, from outside of a charged particle beam writing apparatus by an external interface circuit included in the charged particle beam writing apparatus, a dose modulation value for each of a plurality of figure patterns to be written to a target object and including an amount of correction of a dimension variation due to a proximity effect;
    virtually dividing a writing region of the target object into a plurality of mesh regions;
    calculating, for each of the plurality of mesh regions, an area density of each a plurality of figure patterns arranged in the mesh region;
    performing, for each figure pattern arranged in the mesh region, a weighting of the calculated area density for the mesh region based on the received dose modulation value for the corresponding figure pattern; and
    calculating a weighted pattern area density for each of the plurality of mesh regions as a sum of the weighted area density of each figure pattern in the mesh region;
    calculating a fogging correction dose coefficient for correcting a dimension variation due to a fogging effect by using the weighted pattern area density for each mesh region;
    calculating a dose of a charged particle beam by using the fogging correction dose coefficient and the received dose modulation value; and
    writing a pattern on a target object with the charged particle beam of the dose.

* * * * *